(12) United States Patent
Lu et al.

(10) Patent No.: US 8,563,347 B2
(45) Date of Patent: Oct. 22, 2013

(54) METHOD FOR PRODUCING A THIN-FILM PHOTOVOLTAIC CELL HAVING AN ETCHANT-RESISTANT ELECTRODE AND AN INTEGRATED BYPASS DIODE AND A PANEL INCORPORATING THE SAME

(75) Inventors: Meijun Lu, Hockessin, DE (US); Lap-Tak Andrew Cheng, Newark, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 64 days.

(21) Appl. No.: 13/297,563

(22) Filed: Nov. 16, 2011

(65) Prior Publication Data
US 2012/0295387 A1 Nov. 22, 2012

Related U.S. Application Data

(60) Provisional application No. 61/485,751, filed on May 13, 2011, provisional application No. 61/485,745, filed on May 13, 2011, provisional application No. 61/485,740, filed on May 13, 2011, provisional application No. 61/485,695, filed on May 13, 2011, provisional application No. 61/414,486, filed on Nov. 17, 2010, provisional application No. 61/414,479, filed on Nov. 17, 2010, provisional application No. 61/414,467, filed on Nov. 17, 2010, provisional application No. 61/414,464, filed on Nov. 17, 2010.

(51) Int. Cl.
*H01L 31/05* (2006.01)

(52) U.S. Cl.
USPC ........ 438/59; 438/98; 136/256; 257/E31.113; 257/E27.125

(58) Field of Classification Search
USPC .............. 438/59, 98; 136/256; 257/E31.113, 257/E27.125
See application file for complete search history.

(56) References Cited

U.S. PATENT DOCUMENTS

| | | | |
|---|---|---|---|
| 3,672,999 A | 6/1972 | Barbera | |
| 4,292,092 A | 9/1981 | Hanak | |
| 4,324,719 A | 4/1982 | Weaver et al. | |
| 5,391,235 A | 2/1995 | Inoue | |
| 5,688,366 A | 11/1997 | Ichinose et al. | |
| 6,271,462 B1 | 8/2001 | Tsuzuki et al. | |
| 6,316,832 B1 | 11/2001 | Tsuzuki et al. | |
| 6,600,100 B2 * | 7/2003 | Ho et al. | 136/255 |
| 6,680,432 B2 | 1/2004 | Sharps et al. | |
| 6,784,358 B2 | 8/2004 | Kukulka | |

(Continued)

FOREIGN PATENT DOCUMENTS

| | | |
|---|---|---|
| JP | 03-024768 | 1/1991 |
| WO | 2009/097588 | 8/2009 |

*Primary Examiner* — George Fourson, III

(57) ABSTRACT

A method for producing a thin-film solar cell with a cell level integrated bypass diode includes forming at least first, second and third series-connected cells on a support, each cell being a laminated structure comprising a junction layer including semiconducting material of a first and second type, a front electrode formed of a transparent conductive oxide resistant to an etchant disposed in electrical contact with the semiconducting material of the first type, and a back electrode in electrical contact with the semiconducting material of the second type. A portion of both the back electrode and the junction layer are separated from a selected parent solar cell. Using the separated portion of the back electrode the semiconducting material of the second type of the separated portion of the junction layer is connected to the semiconducting material of the first type of any one chosen solar cell in the array.

43 Claims, 18 Drawing Sheets

(56) References Cited

U.S. PATENT DOCUMENTS

| | | |
|---|---|---|
| 6,864,414 B2 | 3/2005 | Sharps et al. |
| 6,966,184 B2 | 11/2005 | Toyomura et al. |
| 7,115,811 B2 | 10/2006 | Ho et al. |
| 7,977,567 B2 * | 7/2011 | Bett et al. ............... 136/244 |
| 8,344,468 B2 * | 1/2013 | Roizin et al. ............. 257/431 |
| 2001/0007772 A1 | 7/2001 | Li et al. |
| 2001/0049331 A1 | 12/2001 | Chang |
| 2002/0164834 A1 | 11/2002 | Boutros et al. |
| 2004/0118446 A1 | 6/2004 | Toyomura |
| 2004/0159102 A1 * | 8/2004 | Toyomura et al. ........... 60/641.8 |
| 2005/0121067 A1 | 6/2005 | Toyomura et al. |
| 2010/0313935 A1 * | 12/2010 | Coakley et al. ............. 136/249 |
| 2012/0000502 A1 * | 1/2012 | Wiedeman et al. ........... 136/244 |
| 2012/0295387 A1 * | 11/2012 | Lu et al. ..................... 438/59 |

* cited by examiner

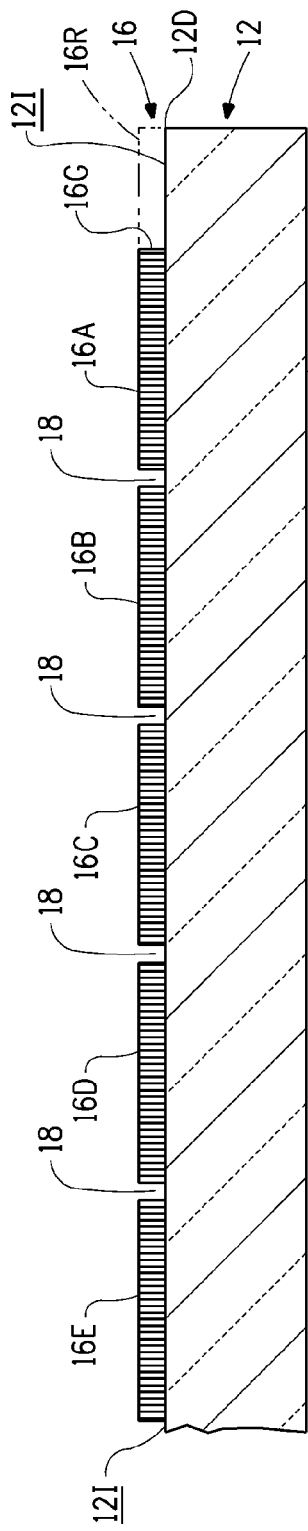
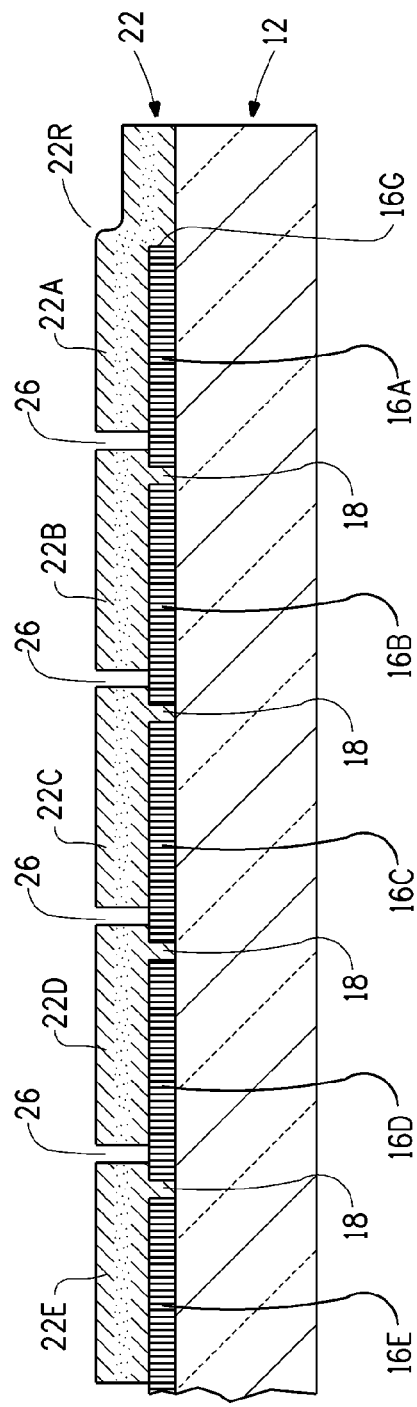
FIG. 1A (Prior Art)
FIG. 1B (Prior Art)

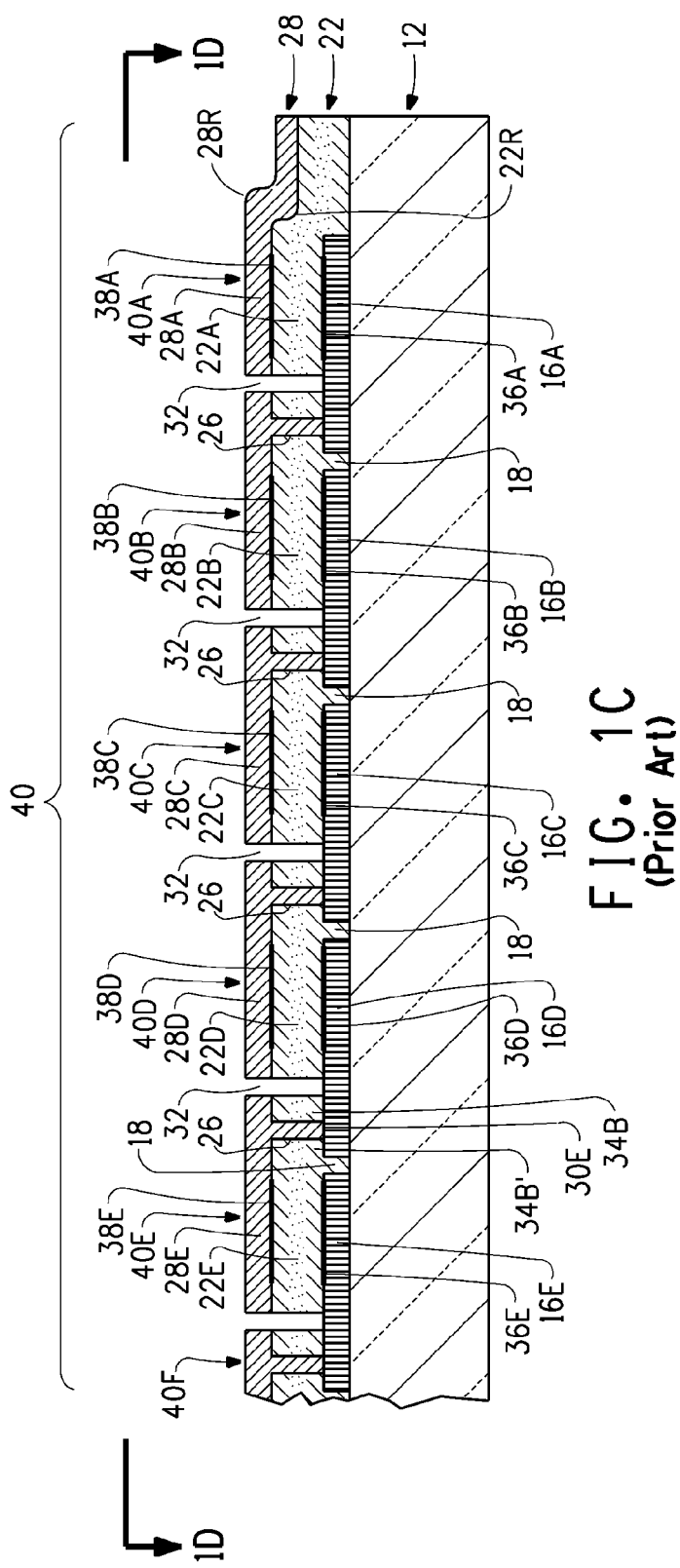
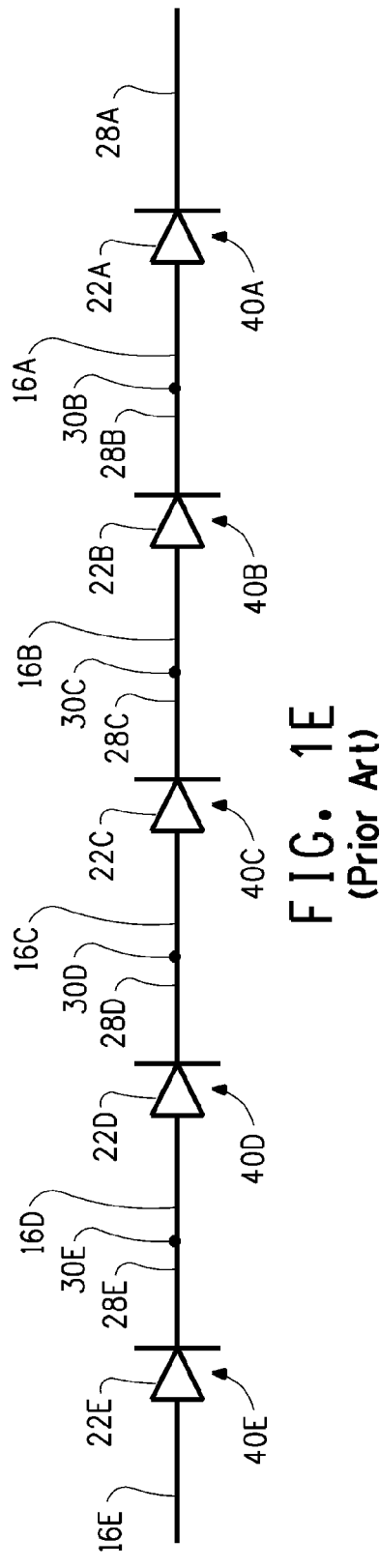
FIG. 1C (Prior Art)
FIG. 1E (Prior Art)

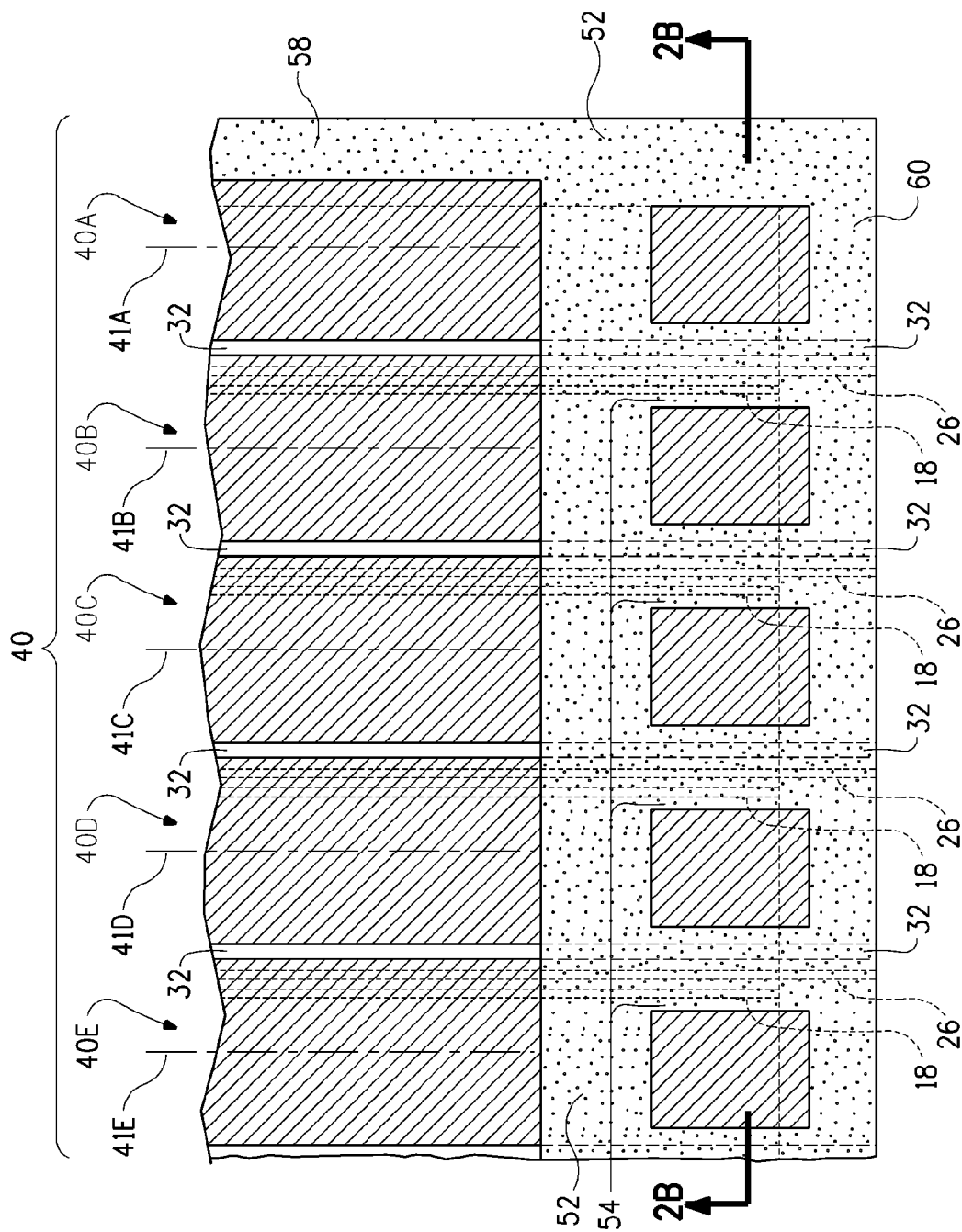

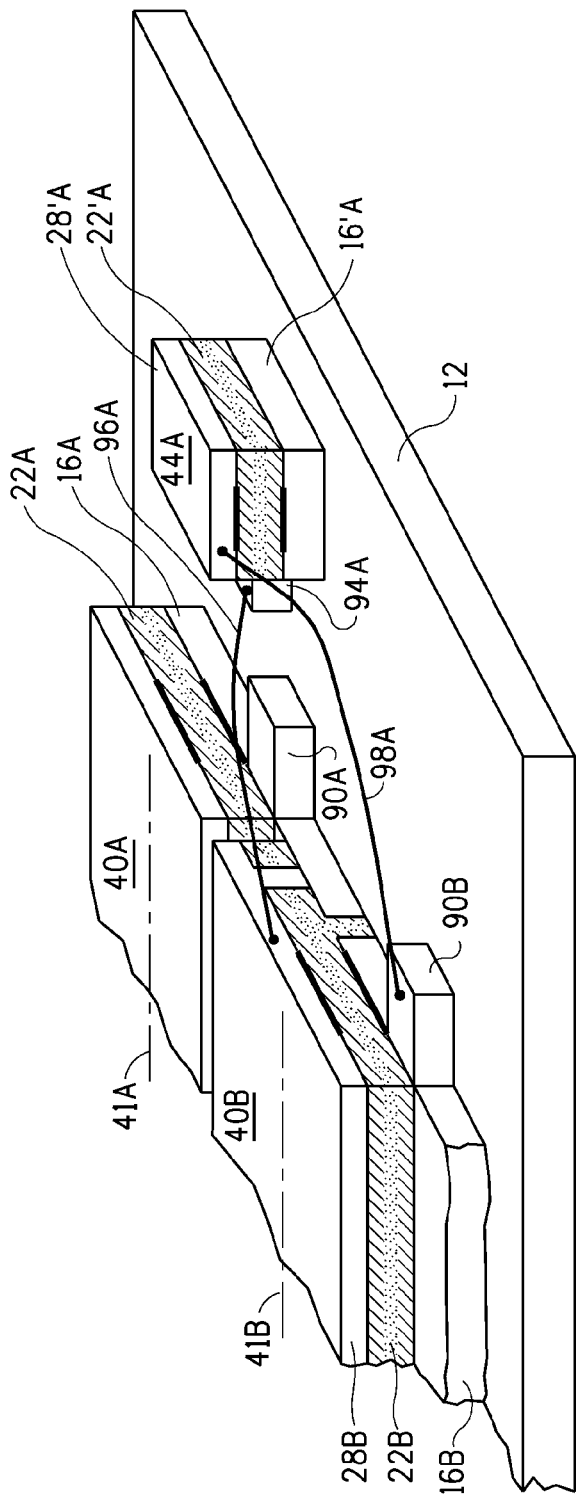
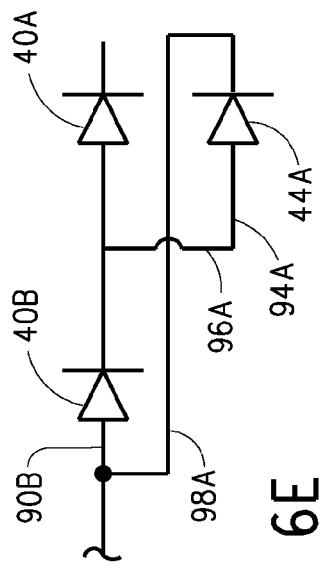
FIG. 6D
FIG. 6E

METHOD FOR PRODUCING A THIN-FILM PHOTOVOLTAIC CELL HAVING AN ETCHANT-RESISTANT ELECTRODE AND AN INTEGRATED BYPASS DIODE AND A PANEL INCORPORATING THE SAME

CLAIM OF PRIORITY

This application claims priority from each of the following United States Provisional Applications, each of which is hereby incorporated by reference:

(1) Method For Producing A Thin-Film Photovoltaic Cell Having An Etchant-Resistant Electrode And An Integrated Bypass Diode And A Panel Incorporating The Same, Application Ser. No. 61/414,464, filed Nov. 17, 2010;

(2) A Thin-Film Photovoltaic Cell Having An Etchant-Resistant Electrode And An Integrated Bypass Diode And A Panel Incorporating The Same, Application Ser. No. 61/414,467, filed Nov. 17, 2010;

(3) Method For Producing An Array Of Thin-Film Photovoltaic Cells Having An Etchant-Resistant Electrode And An Integrated Bypass Diode Associated With A Plurality Of Cells And A Panel Incorporating The Same, Application Ser. No. 61/414,479, filed Nov. 17, 2010;

(4) Array Of Thin-Film Photovoltaic Cells Having An Etchant-Resistant Electrode And An Integrated Bypass Diode Associated With A Plurality Of Cells And A Panel Incorporating The Same, Application Ser. No. 61/414,486, filed Nov. 17, 2010;

(5) Method For Producing An Array Of Thin-Film Photovoltaic Cells Having A Totally Separated Integrated Bypass Diode And Method For Producing A Panel Incorporating The Same, Application Ser. No. 61/485,695, filed May 13, 2011;

(6) Array Of Thin-Film Photovoltaic Cells Having A Totally Separated Integrated Bypass Diode And A Panel Incorporating The Same, Application Ser. No. 61/485,740, filed May 13, 2011;

(7) Method For Producing An Array Of Thin-Film Photovoltaic Cells Having A Totally Separated Integrated Bypass Diode Associated With A Plurality Of Cells And Method For Producing A Panel Incorporating The Same, Application Ser. No. 61/485,745, filed May 13, 2011; and (8) Array Of Thin-Film Photovoltaic Cells Having A Totally Separated Integrated Bypass Diode Associated With A Plurality Of Cells And A Panel Incorporating The Same, Application Ser. No. 61/485,751, filed May 13, 2011.

CROSS-REFERENCE TO RELATED APPLICATIONS

Subject matter disclosed herein is disclosed in the following copending applications, all filed contemporaneously herewith and all assigned to the assignee of the present invention:

A Thin-Film Photovoltaic Cell Having An Etchant-Resistant Electrode And An Integrated Bypass Diode And A Panel Incorporating The Same, Application Ser. No. 61/414,464, filed Nov. 17, 2010;

Method For Producing An Array Of Thin-Film Photovoltaic Cells Having An Etchant-Resistant Electrode And An Integrated Bypass Diode Associated With A Plurality Of Cells And A Panel Incorporating The Same, Application Ser. No. 61/414,467, filed Nov. 17, 2010;

Array Of Thin-Film Photovoltaic Cells Having An Etchant-Resistant Electrode And An Integrated Bypass Diode Associated With A Plurality Of Cells And A Panel Incorporating The Same, Application Ser. No. 61/414,467, filed Nov. 17, 2010;

Method For Producing An Array Of Thin-Film Photovoltaic Cells Having A Totally Separated Integrated Bypass Diode And Method For Producing A Panel Incorporating The Same, Application Ser. No. 61/485,695, filed May 13, 2011;

Array Of Thin-Film Photovoltaic Cells Having A Totally Separated Integrated Bypass Diode And A Panel Incorporating The Same, Application Ser. No. 61/485,740, filed May 13, 2011;

Method For Producing An Array Of Thin-Film Photovoltaic Cells Having A Totally Separated Integrated Bypass Diode Associated With A Plurality Of Cells And Method For Producing A Panel Incorporating The Same, Application Ser. No. 61/485,745, filed May 13, 2011; and Array Of Thin-Film Photovoltaic Cells Having A Totally Separated Integrated Bypass Diode Associated With A Plurality Of Cells And A Panel Incorporating The Same, Application Ser. No. 61/485,751, filed May 13, 2011.

BACKGROUND OF THE INVENTION

1. Field of the Invention

This invention relates to a method for producing a thin-film photovoltaic cell having a cell level integrated bypass diode and to the photovoltaic cell produced thereby; and, in particular, to a method which employs one or more chemical etchant(s) to separate a portion of a photovoltaic cell and, by appropriate electrical interconnection, to utilize the separated portion to define a bypass diode for a cell.

2. Description of the Art

A photovoltaic cell converts solar radiant energy (sunlight) incident thereon into electrical energy as the result of the photovoltaic effect. Of particular recent interest is the large-scale and cost-effective conversion of solar radiation into electricity using arrays of photovoltaic cells assembled into photovoltaic panels.

A typical first generation photovoltaic panel involves first producing a large number of photovoltaic cells from thinly sliced substrates of single or polycrystalline silicon. Cells approximately fifteen centimeters square (15 cm×15 cm) are cut from silicon wafers a few hundred microns in thickness and are connected electrically in series to form strings. Multiple strings are further connected in series or in parallel, arranged on a supporting glass pane, and encapsulated with polymeric resin and film to form a photovoltaic module. The module is usually provided with a frame to form the photovoltaic panel.

A second generation photovoltaic panel involves utilizing a thin-film of semiconductor material, for example hydrogenated amorphous silicon (a-Si:H), as the active photovoltaic material. The a-Si:H film is deposited on a supporting superstrate in a glow discharge of silane gas. Resulting thin-film silicon devices exhibit solar conversion efficiencies in excess of ten percent (10%). A unit cell and the tandem cell or multi-junction amorphous silicon solar cell can only provide a small output voltage of up to a few volts (a single junction ~0.9 V; tandem junction ~1.6V; multi-junction, depending upon the number of junctions, more than 2 V). So, a number of solar cells are typically electrically interconnected in series to produce working voltages.

When all cells in an array are illuminated, each cell will be forward biased. However, if one or more of the cells is partially shaded or shadowed (i.e., not illuminated), such as by falling leaves, snow, or if there are physical differences in the cells such as caused by cell breakage, this mismatch in the properties of interconnected cells can create operating problems for series connected solar cells. This mismatch of different cell in output can dramatically decrease the output current of the entire module, and in some cases the mismatched unit cell merely functions as a load to cause heat generation or reverse bias. The excess heat or the strong reverse bias voltage may permanently damage the unit cell or possibly melt the encapsulate material.

To guard against such damage it is known to provide a protective bypass diode. One bypass diode may be connected across several cells, or, for enhanced reliability, each cell may have its own bypass diode connected in parallel and in an opposite direction thereto, thereby reducing the influence of such a mismatch. If the cells are working normally with fully illumination and producing energy, the bypass diodes are reverse biased and the current flow is through the cells. However, if any mismatch happens, the current flow through the cell becomes limited and reverse biased, the parallel-connected bypass diode becomes forward biased, and current flow is conducted through the bypass diode, thereby protecting the affected cell.

U.S. Pat. Pub. No. 2002/0164,834 (Boutros et al.) discloses a method for making a solar cell with an integrated bypass diode. The method comprises multiple steps of depositing layers with opposite type and different level of dopants on one surface layer of the solar cell to form a bypass diode.

U.S. Pat. No. 6,784,358 (Kukulka) shows a solar cell structure with a discrete amorphous silicon bypass diode. A discrete amorphous silicon bypass diode is supported on either the first or second metallization layer of the cell.

The above mentioned configurations, however, require additional semiconductor steps to incorporate the diode into the substrate. The approaches are complex and cause assembly difficulties, for example in the case of series connections, it is very complicated. Manufacturing cost increase commensurately.

Accordingly, in view of the foregoing, it is believed advantageous to provide an efficient method for production of photovoltaic panels with cell-level integrated bypass diodes with reduced costs.

SUMMARY OF THE INVENTION

In general, the present invention relates to a method for manufacturing a thin-film silicon photovoltaic cell having a cell level integrated bypass diode and to the photovoltaic cell produced thereby.

The method includes the formation of an array of series-connected solar cells on a support layer. The array includes at least a first, a second and a third solar cell. Each solar cell is a laminated structure comprising: a photovoltaic junction layer including a semiconducting material of a first type and a semiconducting material of a second type; a front electrode disposed in electrical contact with the semiconducting material of the first type; and a back electrode disposed in electrical contact with the semiconducting material of the second type.

In accordance with the present invention the method also includes the steps of:
  separating from a selected parent solar cell at least a portion of both the back electrode and the photovoltaic junction layer; and
  using the separated portion of the back electrode, connecting the semiconducting material of the second type of the separated portion of the photovoltaic junction layer to the semiconducting material of the first type of any one chosen solar cell in the array.

The semiconducting material of the first type in the separated photovoltaic portion of the junction layer may be connected to either the same or a different chosen solar cell in the array such that a bypass diode is disposed parallel with and in opposition to one or more cells in the array.

In one embodiment of the invention, during the separating step, the front electrode of the parent solar cell is left intact so that the semiconducting material of the first type of the separated portion of the photovoltaic junction layer is electrically connected with the semiconducting material of the second type of the second solar cell through physical contact between the front electrode of the first solar cell and the back electrode of the second solar cell.

In one instance of this embodiment, if the first and second solar cells are adjacent to each other, during the connecting step the semiconducting material of the second type of the separated portion of the photovoltaic junction layer is connected with the semiconducting material of the first type of the second solar cell so that a bypass diode that is connected in parallel with and in opposition to the second solar cell is defined.

In another instance of this embodiment, if the first, second and third solar cells are adjacent to each other, during the connecting step the semiconducting material of the second type of the separated portion of the photovoltaic junction layer is connected with the semiconducting material of the first type of the third solar cell, the bypass diode being connected in parallel and in opposition to both the second and third solar cells.

In yet another instance of this embodiment, if the first and second are adjacent and the third solar cell is spaced a predetermined number of solar cells away from the second solar cell, the semiconducting material of the second type of the separated portion of the photovoltaic junction layer may be connected with the semiconducting material of the first type of the third solar cell, so that the bypass diode is connected in parallel and in opposition to the second and third solar cells and to all solar cells therebetween.

In an alternate embodiment of the invention, during the separating step a portion of the front electrode is also separated from the parent solar cell thereby totally segregating the separated portions of the front electrode, back electrode and photovoltaic junction layer from the first solar cell.

The semiconducting material of the second type of the separated portion of the photovoltaic junction layer may be connected with the semiconducting material of the first type of either the parent solar cell or of any other chosen cell. The semiconducting material of the first type of the separated portion of the photovoltaic junction layer may also be connected to the semiconducting material of the second type of either the parent cell or the same or a different chosen cell.

For example, if the first and the second solar cells are adjacent to each other, and if the first solar cell is the parent solar cell, the semiconducting material of the second type of the separated portion of the photovoltaic junction layer may be connected with the semiconducting material of the first type of either the parent solar cell or the second solar cell. The semiconducting material of the first type of the separated portion of the photovoltaic junction layer may be connected to the semiconducting material of the second type of either the parent cell or the second solar cell. If the materials of the junction layer are each connected to the respective opposite polarity materials of the same cell (i.e., both to either the parent or to the second cell), then the bypass diode is connected in parallel and in opposition to that cell.

If the materials of the junction layer are connected to the opposite materials different cells (i.e., to the parent and to the second cell), then the bypass diode is connected in parallel and in opposition to those cells.

In the cell array produced as a result of the method of the present invention the bypass diode is spaced from the selected parent solar cell along the axis of the parent solar cell. In addition, in the preferred instance, corresponding interfaces between each semiconducting material and the electrode with which it is in contact in both the parent solar cell and in the bypass diode are substantially coplanar with the respective first and second interfaces defined in the parent solar cell.

BRIEF DESCRIPTION OF THE DRAWINGS

The invention will be more fully understood from the following detailed description taken in connection with the accompanying drawings, which form a part of this application, and in which:

FIGS. 1A, 1B and 1C are diagrammatic, front elevation views entirely in section illustrating the structures formed in an array of photovoltaic solar cells after each of a series of process steps in accordance with one common prior art manufacturing process, while FIG. 1E is the equivalent circuit diagram of the finished cell array;

FIG. 2A is a plan view illustrating the array of cells shown in FIGS. 1C and 1D wherein an etchant is disposed in a predetermined pattern in accordance with the present invention;

FIG. 6D is a stylized perspective view, similar to FIG. 6B, illustrating a totally separated bypass diode connected to a chosen solar cell in the array other than the parent solar cell;

FIG. 6E is an equivalent circuit diagram of the cell with the bypass diode being connected as shown in FIG. 6D;

DETAILED DESCRIPTION OF THE INVENTION

Figure 1D:
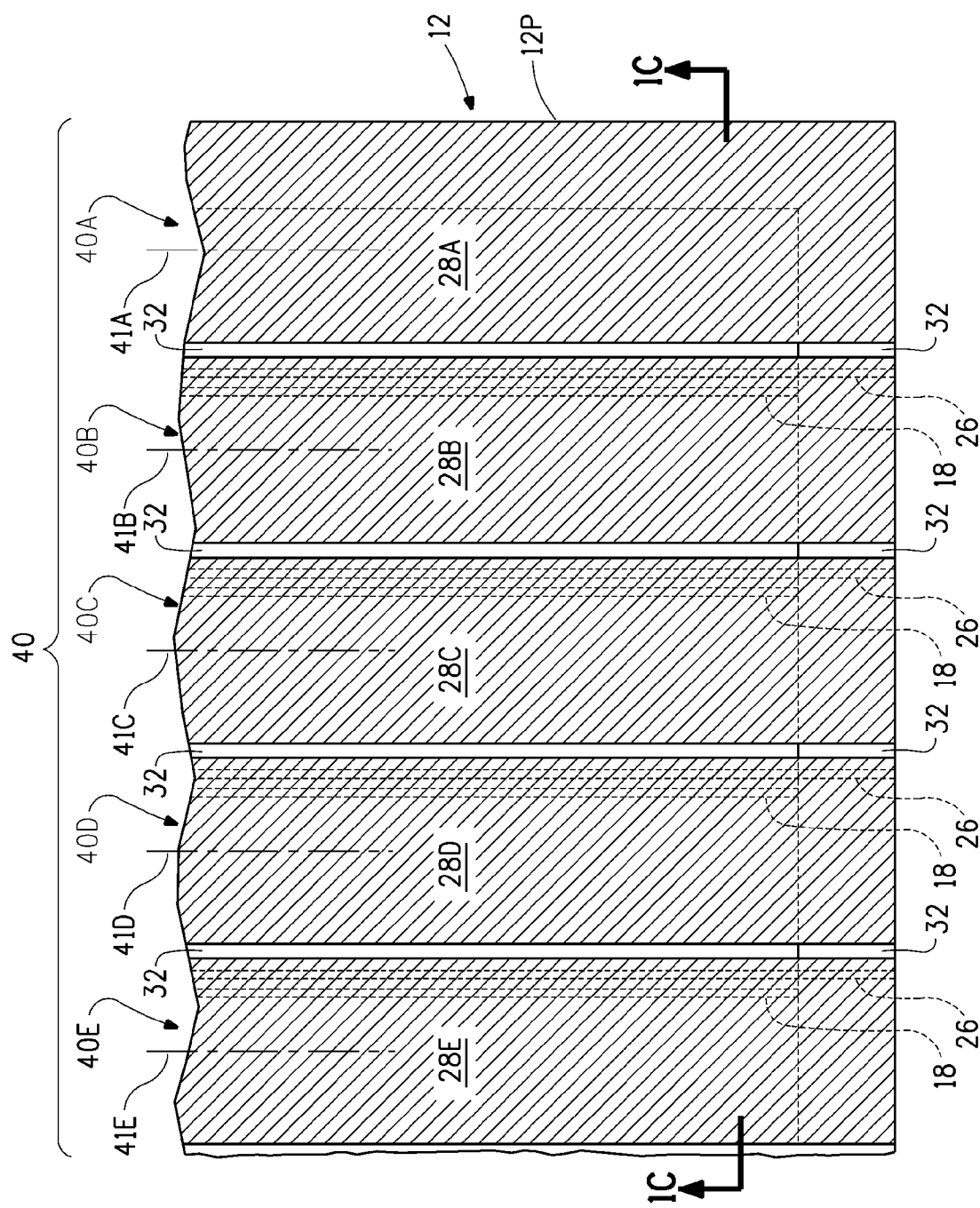
FIG. 1D is a plan view of the array of cells shown in FIG. 1C.

Throughout the following detailed description similar reference numerals refer to similar elements in all Figures of the drawings. It should be understood that details illustrating the structure of the present invention as shown in various Figures have been stylized in form, with some portions enlarged or exaggerated, all for convenience of illustration and ease of understanding.

FIGS. 1A through 3B collectively illustrate the various steps in a method in accordance with a first embodiment of present invention for producing a thin-film photovoltaic solar cell with an associated cell level integrated bypass diode. The term "cell level" as used in this application means that each bypass diode is produced from the structure of a parent solar cell and the diode is associated with and able to provide bypass protection for at least one photovoltaic solar cell.

Figure 4A:
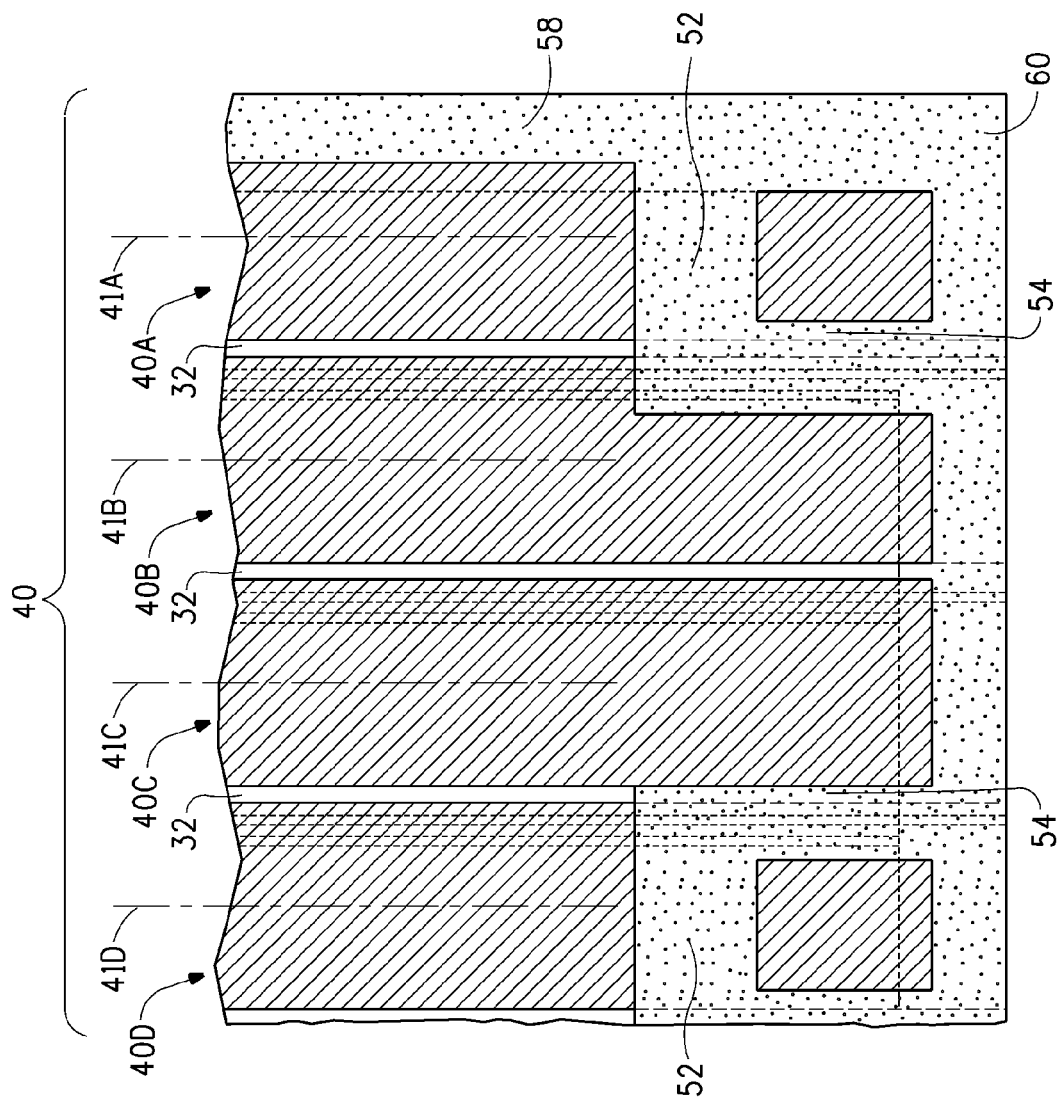
FIG. 4A is a plan view generally similar to FIG. 2A illustrating the array of cells shown in FIGS. 1C and 1D wherein an etchant is disposed in an alternative predetermined pattern in accordance with the present invention.
Figure 4B:
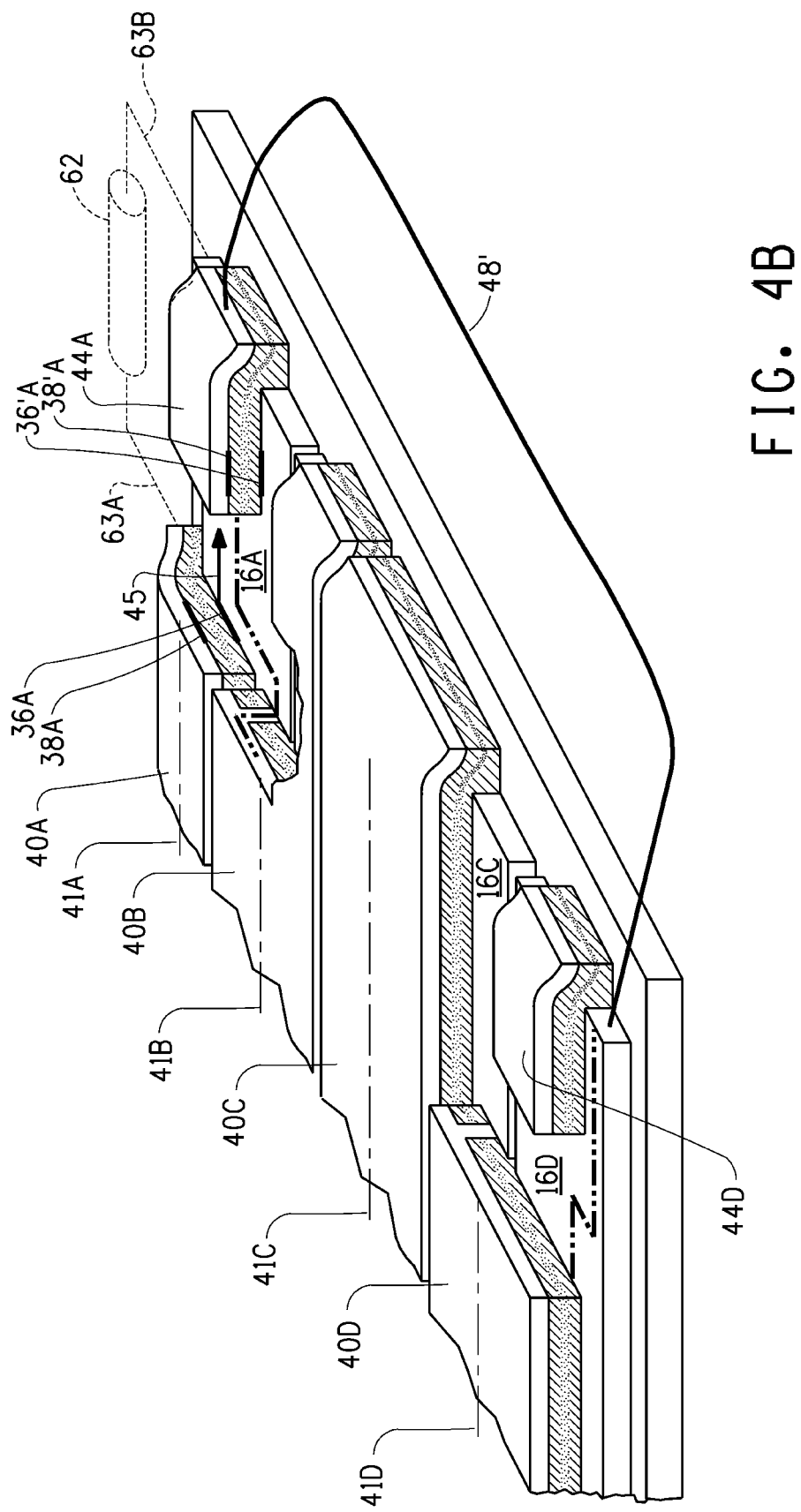
FIG. 4B is a stylized perspective view generally similar to FIG. 3A illustrating the structure of four adjacent cells and adjacent bypass diodes resulting after removal of the etchant disposed in accordance with the pattern of FIG. 4A, in which one bypass diode is associated with and able to provide bypass protection for more than one solar cell.
Figure 4C:
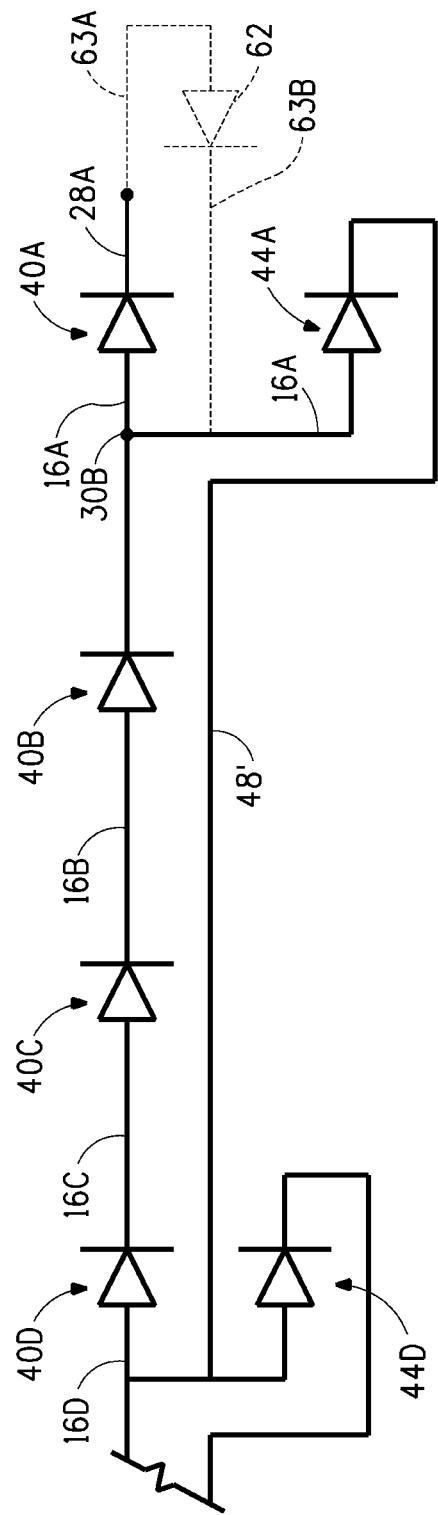
FIG. 4C is an equivalent circuit diagram of the modified arrangement shown in FIG. 4B.

However, it should be understood that a bypass diode formed in accordance with this embodiment of the present invention may be associated with and provide bypass protection for more than one cell, if desired. An illustration of a modified step in the method and the structure and corresponding circuit diagram of the resultant cell/bypass diode combination are shown in FIGS. 4A, 4B and 4C.

The first step in the method comprises forming an array generally indicated by the reference character 40 (e.g., FIGS. 1C, 1D) that includes at least two or more photovoltaic solar cells on the interior surface 12I of a support layer 12. The support layer 12 has an exterior surface 12E. The support layer 12 can take any convenient shape but it is usually rectangular (or square) in plan (as illustrated herein). If the surface 12E eventually defines the sun-facing top surface of a finished photovoltaic panel the support layer is usually termed a "superstrate" and is made of a etchant-resistant transparent material, typically glass or a polymer. Since in the embodiments being described the support layer does define the sun-facing surface of the array being formed, the term "superstrate" shall be used hereafter. However, it should be understood that the present invention is also applicable to an arrangement in which the support layer does not face the sun. In this instance the support layer is usually termed a "substrate". The substrate may be made of etchant-resistant glass, polymer or a non-transparent metal. Although one preferred method of realizing the array of solar cells is described in detail herein, it should be appreciated that the array may be realized using any desired fabrication method.

FIGS. 1A through 1C are diagrammatic front elevation views entirely in section across the width dimension of a portion of the array 40 of series-connected photovoltaic solar cells formed on the superstrate 12. FIGS. 1A through 1C illustrate the structures of the solar cells produced after each of a series of process steps in accordance with one common prior art manufacturing process substantially as disclosed in U.S. Pat. No. 4,292,092 (Hanak). FIG. 1D is a plan view of a portion of the lengthwise dimension of the cell array 40 shown in FIG. 1O, while FIG. 1E is a circuit diagram of the portion of the array 40 shown in FIGS. 1O and 1D. The portion of the array 40 illustrated in FIGS. 1C and 1D contains five adjacent photovoltaic solar cells, respectively indicated by reference characters 40A, 40B, 40C, 40D and 40E, although it should be understood that any convenient number of cells greater than two may be fabricated. In a typical instance, a support layer measuring three-by-five (3×5) feet could contain an array having N solar cells, where N may be on the order of one hundred (100) solar cells, with each cell being approximately 0.35 inches in width.

FIG. 1A shows an early step in the formation of the array 40. In this step substantially the entire interior surface 12I of the superstrate 12 is coated with a layer of a transparent conducting oxide (TOO), generally indicated by the reference character 16. The TCO layer usually has a thickness on the order of about one micrometer (1 μm). In the structure discussed in FIGS. 1A through 3B the transparent conductive oxide is an etchant-resistant electrode material. A suitable etchant-resistant TCO electrode material is halogen-doped tin oxide, such as fluorine-doped tin oxide (FTO). In a second embodiment of the invention to be described the TCO electrode material may be an etchant-resistant material or a material susceptible to either an acid or basic etchant, such as indium doped tin oxide (ITO), zinc oxide (ZnO), gallium oxide (GaO) or tin oxide.

As shown in FIG. 1A the electrode layer 16 has a series of breaks 18 formed therein. The breaks 18 extend through the full thickness of the material of the electrode layer 16 to the surface 12I of the glass superstrate 12. The breaks 18 subdivide the electrode layer 16 into a plurality of electrically isolated strips 16A through 16E. Each strip 16A through 16E extends lengthwise along the superstrate 12 (i.e., into the plane of FIGS. 1A,1C and along the plane of FIG. 1D). Each strip 16A through 16E serves to define an incident, or front, electrode for a respective solar cell 40A through 40E, as will be described.

The breaks 18 may be formed using a laser-scribing process. Laser scribing involves scanning a focused laser beam of sufficient power and appropriate wavelength to ablate a narrow width of the electrode layer along the scan line.

Since the electrode material is etchant-resistant it is difficult to remove chemically. Accordingly, before or after the laser scribing that produces the breaks 18 the entire peripheral margin of the electrode layer 16 is removed by mechanical action, such as grinding or sand blasting. A portion of the removed region 16R of the electrode layer 16 is indicated in phantom lines on FIG. 1A. Removal of the region 16R from the margin of the electrode layer 16 exposes a portion of the interior surface 12I of the superstrate 12 and defines a peripheral edge 16G along the width and/or length dimensions of the electrode strips. The edge 16G is typically located at about one centimeter (1 cm) inwardly of the peripheral edge 12P of the superstrate 12. Since such mechanical removal is a dusty process it is usually performed away from the clean room area where the other steps of the process are performed. After mechanical removal of the electrode material the superstrate 12 is thoroughly washed in preparation for further processing steps.

As a next step, illustrated in FIG. 1B, a photovoltaic junction layer generally indicated by the reference character 22 is deposited over the superstrate 12 and the electrode strips 16A through 16E thereon. In practice, the junction layer 22 is the active region of the solar cell (and any diode formed therefrom) and comprises at least one stratum of a semiconducting material of a first type (e.g., "p-type" amorphous silicon material), at least one stratum of a semiconducting material of a second type (e.g., "n-type" amorphous silicon material), and, optionally, one or more intermediate stratum(a) of an intrinsic semiconducting material. In the drawings the strata of "p-type" and the "n-type" amorphous semiconducting materials in the junction layer 22 are illustrated by hatching and any intermediate stratum(a) of intrinsic semiconducting material is indicated by stippling. As seen in FIG. 1B the junction layer 22 extends into and fills the breaks 18 between adjacent front electrode strips. The junction layer 22 extends beyond the edge 16G of the electrode 16A and lies directly on the exposed glass extending along the peripheral regions of the superstrate 12. The absence of electrode material in these peripheral regions imparts a rolled-off contour 22R to the junction layer 22 along the portions of the perimeter of the superstrate 12 from which the front electrode is removed. It should be noted that if bypass diodes are to be formed in accordance with either implementation of the second embodiment of the invention (to be discussed herein), the removal of electrode material from the region 16R along the peripheral margin of the array may be omitted.

Each of the various strata of materials forming the photovoltaic junction layer may be deposited using any one of a variety of deposition techniques, including PECVD, hot wire CVD, and photochemical vapor deposition in the presence of silane and other alloying and doping gases, for example phosphine for n-type amorphous silicon and diborane for p-type amorphous silicon. Typically each silicon stratum ranges in thickness from a few hundred nanometers (amorphous silicon) to a few thousand nanometers (microcrystalline silicon), such that the overall thickness of the junction layer is on the order of few hundred nanometers to a few micrometers. The strata of "p-type" and the "n-type" materials may be reversed in a "substrate" structure which can use non-transparent material as the support layer and in which light enters from the opposite side of the cell.

Once deposited, the photovoltaic layer 22 is itself separated into adjacent strips 22A through 22E of semiconducting material by breaks 26. The breaks 26 may be formed by laser scribing. The breaks 26 run parallel to but slightly displaced from the breaks 18 between adjacent front electrode strips. Each break 26 extends through the full thickness of the junction layer 22 and exposes a portion of the surface of a front electrode strip 16A through 16E, as the case may be.

The next step in the process of forming the array 40 of photovoltaic solar cells is shown in FIGS. 1C and 1D. In this step a second layer of an electrically conductive material, generally indicated by the reference character 28, is deposited over the entire photovoltaic junction layer 22. This second conductive layer 28 forms the back electrode of each solar cell in the array.

The conductive material of the second conducting layer 28 not only covers the entire surface of each strip 22A through 22E of the junction layer, but also extends into and fills the breaks 26 to make electrical contact with the surface of the front electrode strip exposed by the break 26. The contact point between paired back and front electrodes is indicated in the Figures by reference character 30. The back electrode layer 28 also exhibits a rolled-off contour 28R imparted due to presence of the rolled contour 22R of the photovoltaic layer 22 defined along the periphery of the superstrate 12.

The material of the back electrode 28, for example, silver, may be deposited by sputtering to a thickness on the order of a few hundred nanometers. Of course, a different conductive material may be used and applied in any convenient manner. For example, for some silicon thin-film modules, in order to improve electrical performance the back electrode may be formed from two or more layers of chemically distinct materials. Such a dual layer back electrode comprising a first stratum of zinc oxide (ZnO) and a second stratum of silver is well known.

A third laser scribing operation forms breaks 32 that run parallel to but slightly displaced from the breaks 26 in the junction layer 22. The breaks 32 separate the second electrode layer 28 into adjacent strips 28A through 28E. Usually the breaks 32 also extend through the respective strips 22A through 22E of the photovoltaic junction layer lying beneath the electrode strips 28A through 28E.

The regions 34B are electrically short-circuited "dead regions" because the front side electrode (FTO) and back side electrode (metal) are connected.

As described in U.S. Pat. No. 4,292,092 (Hanak), a continuously excited (CW) neodymium YAG laser radiating at 1.06 micrometers operated in a Q-switched mode at a pulse rate of about 36 kHz and a scribing rate of about 20 cm/sec can be used in the laser scribing process. The power for first laser scribe (breaks 18 in the TCO layer) is about 4.5 watts. The power for the laser scribe to form the breaks 26 (FIG. 1B, TCO+a-Si) is about 1.7 watts, and the power for the laser scribe to form the breaks 32 (FIG. 1C, a-Si+metal) is about 1.3 watts.

The net result of the combination of steps shown in FIGS. 1A through 1D is the formation of an array 40 comprising a plurality of individual photovoltaic solar cells 40A through 40E each supported on the superstrate 12. Each solar cell 40A through 40E has a respective major axis 41A through 41E (FIGS. 1D, 2A, 3A) that extends along the lengthwise dimension of the array. Each solar cell 40A through 40E is formed as a laminated structure comprising:

a photovoltaic junction layer (22A through 22E, respectively) having at least a semiconducting material of a first type and a semiconducting material of a second type;

a respective front electrode 16A through 16E (in this embodiment formed of an etchant-resistant transparent conductive oxide); and a respective back electrode 28A through 28E.

Each front electrode 16A through 16E is in electrical contact with one stratum of semiconducting material in a respective strip 22A through 22E of the junction layer. The interface 36A through 36E between a front electrode 16A through 16E and one of the semiconducting materials of its associated junction layer strip 22A through 22E is indicated in the Figures as a bold dark line. The major portion of each interface 36A through 36E (other than the rolled-off contour 28R of the cell 40A) is substantially planar and extends substantially parallel to the interior surface 121 of the superstrate 12.

Each back electrode 28A through 28E is in electrical contact with one stratum of semiconducting material in its respective associated strip 22A through 22E of the junction layer. The major portion of the interface 38A through 38E between a back electrode 28A through 28E and one of the semiconducting materials of its associated junction layer strip 22A through 22E (again excluding consideration of the rolled-off contour 28R of the cell 40A) appear as a bold dark line in the Figures. The major portion of each interface 38A through 38E is also substantially planar and extends substantially parallel to the interior surface 121 of the superstrate 12.

An equivalent electrical schematic diagram of the diode array is illustrated in FIG. 1E. Each diode in the array is electrically connected in series with an adjacent diode by virtue of the electrical contact (for example, as illustrated at contact points 30B through 30E in FIG. 1C) between the front electrode of one cell with the back electrode of an adjacent cell.

In accordance with the first embodiment of the present invention a cell level bypass diode for each solar cell is formed by separating or segregating a relatively smaller sized portion of the laminated structure from a solar cell. Each separated portion 44A through 44E (FIG. 3A), when interconnected as will be discussed, defines the cell level bypass diode for one or more adjacent cells.

Each bypass diode may be separated from a parent solar cell by the application of at least one selected chemical etchant material deposited in a predetermined "positive" pattern over the photovoltaic cell array 40. This technique is described more fully herein.

Alternatively, a masking paste may be applied in an inverse pattern which leaves the unmasked areas uncovered. After the masking paste is dried, the unmasked areas are exposed to a wet etchant. The unmasked areas may be exposed by applying the wet etchant directly thereto or by immersing the entire cell array into the wet etchant. The masking paste is then stripped away. In this alternative method the pattern of the mask is the invert of the "positive" pattern created when using etchant paste.

A suitable masking paste typically comprises high-boiling solvents (boiling point>180° C.), such as terpineol (1-methyl-4-(1-methylvinyl)cyclohexan-1-ol) or texanol (2,2,4-trimethyl-1,3-pentanediolmono(2-methylpropanoate)); acid-resistant polymers, such as co-polymers of methacrylic acid and methyl methacrylate, polyphenols and epoxy resins; thermal or photoinitiators; rheology modifiers, such as fumed silica or carbon black; acid-resistant fillers, such as graphite, $TiO_2$, alumina, or tin oxide particles; pigment particles; surfactants; and optionally monomers containing two or more reactive groups. The masking paste is formulated to provide good screen-printed fine features, long on-screen time, high etchant resistance, and ease of aqueous stripping. Masking paste compositions can also be formulated to provide features such as good environmental durability, good adhesion to the back electrode and panel encapsulant. They may be customized for color and texture.

Figure 2B:
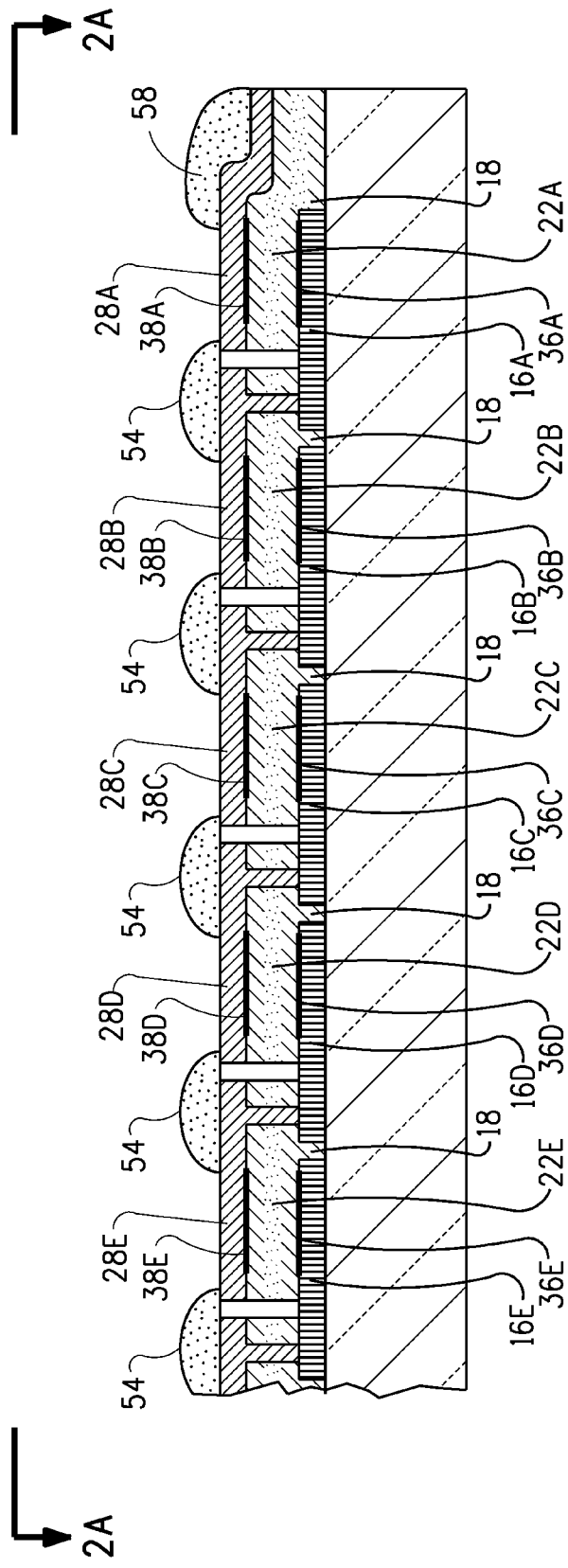
FIG. 2B is an elevation view, in section, taken along section lines 2B-2B in FIG. 2A.

FIGS. 2A and 2B show respective plan and cross sectional views of the array 40 of FIGS. 1C and 1D with a coating of an etchant paste disposed over the back electrode surface in accordance with a first embodiment of the method of the present invention. The positive pattern of the etchant paste is indicated in FIGS. 2A and 2B by the stippled hatching.

As best seen in FIG. 2A, to separate a bypass diode from each solar cell in the array the predetermined etchant paste pattern includes a stripe 52 of paste that extends transversely across all of the solar cells 40A through 40E in a direction substantially perpendicular to the major axes 41A through 41E of the cells. The stripe 52 is intersected by a plurality of relatively shorter stripes 54 of etchant paste that are positioned as will be described between the major axes of adjacent cells and extend generally parallel to those major axes. As suggested in FIG. 4A, if it is not desired to separate a bypass diode from a given parent solar cell, it is simply necessary to omit the portion of the stripe 52 of etchant paste over that cell or cells.

The width dimension of the stripe 52 should be sufficient to separate a junction layer of the diode being formed from its parent cell without unduly sacrificing operative surface area from that parent. A width dimension on the order of about 0.2 cm is convenient to meet these conflicting needs.

Each stripe 54 should be sufficiently wide and positioned so as to overlie at least the location of the scribed break 18 in the front electrode layer 16. The width of each stripe 54 may optionally be sufficient to cover the break 26 or both the breaks 26 and 32. FIGS. 2A and 2B and FIG. 4A show the case in which the stripe 54 covers all three breaks 18, 26 and 32 in the front electrode layer 16, the photovoltaic junction layer 22, and the back electrode layer 28, respectively.

The etchant paste pattern may further include first and/or second edge isolation stripe(s) 58, 60. The first edge isolation stripe(s) 58 (only one of which is illustrated in FIGS. 2A and 2B and 4A) extend(s) along one or both of the lengthwise peripheral edges of the array 40. Additionally or alternatively, the second edge isolation stripe(s) 60 (only one being illustrated in FIGS. 2A, 4A) extend(s) along one or both of the widthwise peripheral edges of the array 40. The stripes 58 and/or 60 should each have a width dimension on the order of about 0.6 cm which is generally sufficient to produce edge isolation regions for further encapsulation of the cell array.

In general, the chemical composition of the etchant paste should be properly formulated to provide effective etch removal of both the back electrode layers and the junction layers lying within the predetermined paste pattern. The etchant paste may be either acidic or basic in nature.

A suitable acidic etchant paste contains a silver and silicon etchant selected from the group consisting of nitric acid, hydrochloric acid, hydrofluoric acid, and mixtures thereof. A combination of nitric and hydrofluoric acids is preferred. The mixture of materials is carried in a polymer binder. Hydrochloric acid may be used to etch zinc oxide or metals (such as aluminum) if such are used. Referencing the dual layer back electrode structure discussed earlier, hydrochloric acid can be combined with nitric acid to form an effective etchant paste for the ZnO and silver layers. The binder comprises polymeric materials selected from the group consisting of poly (vinyl alcohol), poly(ethylene oxide), polyvinylpyrrolidone (PVP) poloxamers and mixtures thereof. Poloxamers are nonionic triblock copolymers composed of a central hydrophobic chain of polyoxypropylene, flanked by two hydrophilic chains of polyoxyethylene.

A suitable basic etchant paste contains multiple caustic etching components selected from the group consisting of alkali hydroxide (such as sodium or potassium hydroxide), ammonium hydroxide and tetramethylammonium hydroxide. The basic mixture of materials is also carried in a polymer binder.

The etchant paste can be dispensed using any suitable dispensing technique used for screen, nozzle or ink-jet printing. This is a very convenient single step patterning technique requiring minimal equipment.

These same acids or bases can be used to produce a wet acidic etchant material or a wet basic etchant material, as the case may be.

When using either an etchant paste or a wet chemical, the etchant paste or a wet chemical is allowed to chemically etch the back electrode layer and the underlying junction layer for a predetermined dwell time depending on the concentration of the etchant and the thickness of the back electrode and the silicon layer. For the thickness of the front electrode, photovoltaic and back electrode layers as discussed above, a dwell time on the order of minutes is usually sufficient. As examples, for single junction a-Si cell, a dwell time on the order of one to two minutes may be sufficient. For a tandem junction solar cell which includes microcrystalline silicon ($\mu$c-Si), a more concentrated etchant is needed, otherwise a longer dwell time, on the order of five to ten minutes, is needed.

Optionally, in order to reduce the required dwell time, the chemical etchant may be heated to a temperature in the range from about 50° C. to about 200° C., and more particularly to a temperature in the range from about 50° C. to about 100° C. One convenient expedient for raising the temperature of the chemical etchant is to raise the temperature of the superstrate using a suitable heating apparatus, such as a hot plate.

At the expiration of the dwell time the superstrate is sprayed with high pressure water or aqueous alkaline solution in order to wash off the etchant material. This insures no etchant material is present to cause deterioration of a resultant solar panel after encapsulation.

Figure 3A:
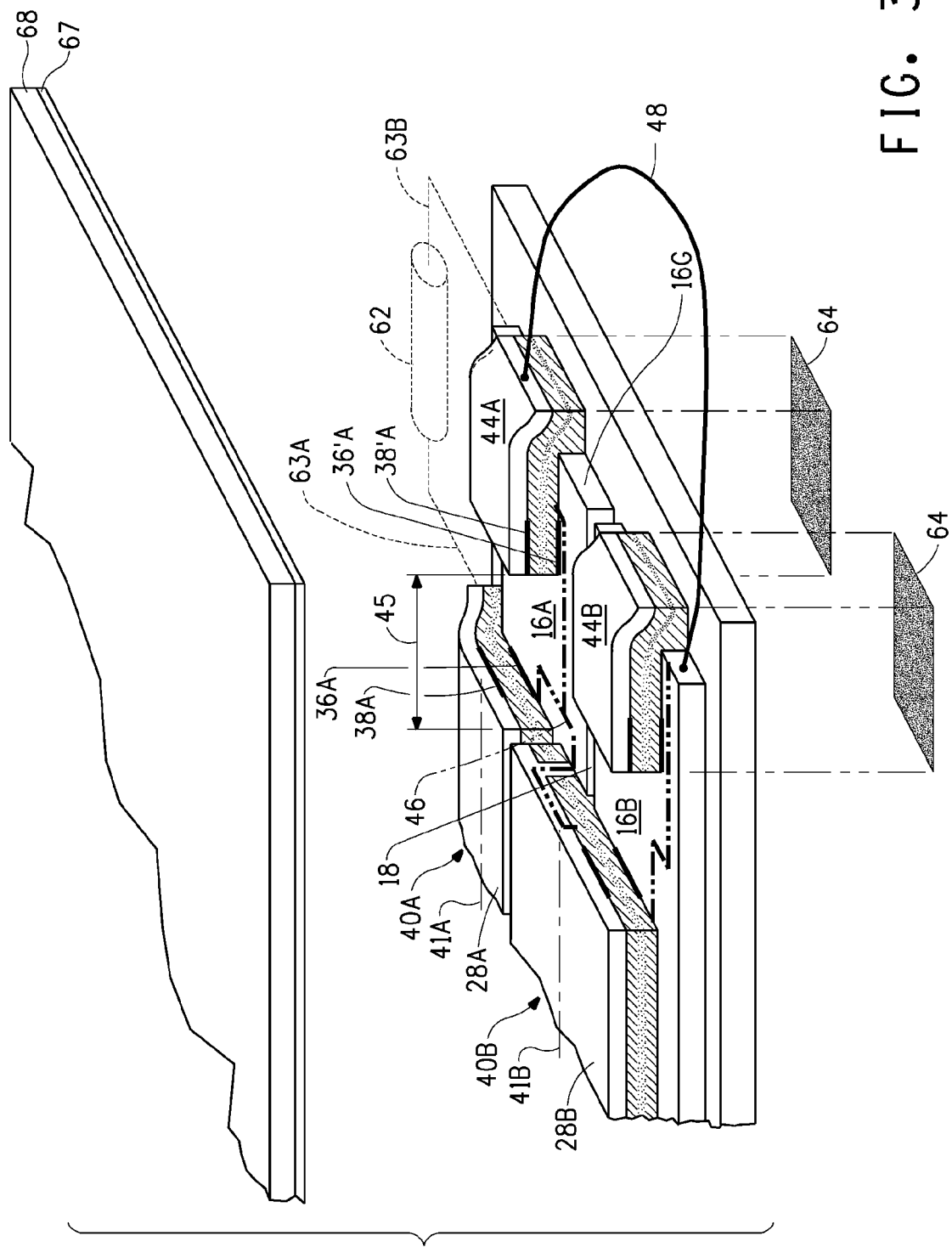
FIG. 3A is a stylized perspective view illustrating the structure of two adjacent cells and adjacent bypass diodes resulting after removal of the etchant, with one of the bypass diodes being connected in parallel opposition to one of the cells.

FIG. 3A shows a stylized perspective view of a portion of the array after removal of the etchant paste. The paste is operative to remove from each cell 40A, 40B selected portions of the back electrode and the photovoltaic junction layer lying within the predetermined pattern (FIG. 2A). Because the material of the front electrode is resistant to etchant it is exposed but left intact. The Si material in the scribed break 18 between adjacent front electrode strips 16A, 16B is also removed. Thus, as a result of the etching action, each silicon solar cell strip which has been exposed to the etchant material is separated into two parts: viz., a major active cell (e.g., parent solar cells 40A, 40B) and respective bypass diodes (e.g., diodes 44A, 44B).

Specifically, the bypass diode 44A includes both a portion 22'A of a photovoltaic junction layer (separated from the photovoltaic junction layer 22A of the parent cell 40A) and a portion 28'A of the back electrode (separated from the back electrode 28A of the parent cell 40A) (FIG. 3A). The primed reference characters indicate that the primed elements of the bypass diode were previously integral with the corresponding elements of the solar cell. The separated portion of the junction layer 22'A is supported by the front electrode 16A.

Structurally, the junction layer 22'A of the bypass diode 44A is spaced a predetermined distance 45 in a direction substantially parallel to the major axis 41A from the junction layer 22A of the first cell 40A. This predetermined distance 45 is governed by the dimension of the stripe 52 of etchant. Similarly, the lateral spacing between the adjacent bypass diodes 44A, 44B is governed by the dimension of the etchant stripe 54. The dimensions of the stripes 52, 54 are selected such that the surface area of the bypass diode 44A is within the range from about one percent (1%) to about five percent (5%) of the surface area of the first solar cell 40A.

In addition to the axial spacing, in the preferred instance the interface 36'A defined within the diode 44A between the front electrode 16A and the one of the semiconducting strata of the separated junction layer 22'A is substantially coplanar with the corresponding interface 36A defined in the parent cell 40A. Similarly, the interface 38'A defined within the diode 44A between the back electrode 28'A and the other semiconducting strata of the separated junction layer 22'A is substantially coplanar with the corresponding interface 38A in the parent cell 40A. However, it lies within the contemplation of the present invention that the interfaces 36A, 36'A may be vertically offset with respect to each other. Such a structural arrangement may be produced, for example, by forming the superstrate 12 in such a way that the regions of the superstrate on which the bypass diodes will be formed are either relatively thicker or thinner than the thickness dimension of the regions of the superstrate on which the solar cells are formed.

The bypass diode 44B, separated by the action of the etchant from its parent solar cell 40B, is analogously configured and supported on the front electrode 16B.

It is noted that if edge isolation etchant stripe(s) 58 and/or 60 are deployed the action of the etchant would remove both the back electrode and the junction layers in those regions, thus exposing the peripheral margins of the superstrate and define a set-back for the diodes 44A, 44B from the widthwise edges of the superstrate.

Figure 3B:
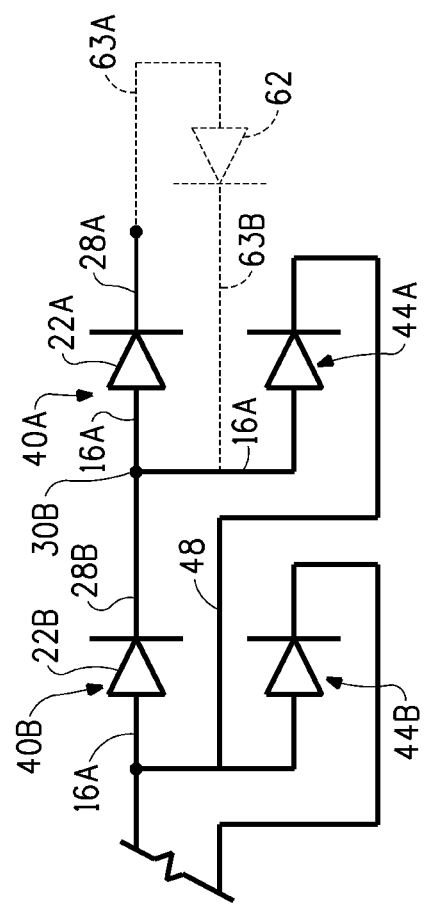
FIG. 3B is an equivalent circuit diagram of the cell with opposed bypass diode arrangement shown in FIG. 3A.

The equivalent electrical schematic diagram of the interconnection of the diode 44A with the first and second solar cells 40A, 40B is shown in FIG. 3B. Electrically, the semiconducting material of the first type of the separated portion of the junction layer 22'A of the diode 44A is connected via the front electrode 16A to the back electrode 28B, as illustrated by the dot-dash connection line 46. The front electrode 16A thus electrically links the semiconducting material of the first type of the separated portion of the junction layer 22'A with the semiconducting material of the first type of the solar cell 40A and with the semiconducting material of the second type of the second solar cell 40B (through the back electrode 28B of the second solar cell 40B).

A separate electrical connection 48 is defined between the semiconducting material of the second type of the separated portion of the junction layer 22'A of the diode 44A and the semiconducting material of the first type of the second solar cell 40B. Specifically, this connection 48 conveniently extends between the portion of the back electrode 28'A of the diode 44A and the front electrode 16B of the second solar cell 40B.

The connection 48 may be implemented by a discrete wire to connect the bypass diode 44A with the front electrode 16B. Alternatively, a metallization may be printed using a screen, nozzle, or ink-jet printing technique to extend over the exposed peripheral portions of the superstrate. Disposing the metallization on the bare glass of the front edge region of the superstrate avoids any shunt problem.

As a result of these electrical interconnections it may be appreciated that a cell level bypass diode (e.g., the diode 44A) may be formed on the superstrate by separation from a parent solar cell and electrically connected in parallel and in opposition to a second solar cell (e.g., the cell 40B). Each of the other bypass diodes separated from a cell in the array may be interconnected with the adjacent cell in a manner analogous to that described hereinabove. In such an arrangement each diode is connected in a one-to-one relationship with a solar cell.

Since the bypass diode 44A separated from the solar cell 40A has been interconnected with the adjacent cell 40B an external diode 62 is connected by lines 63A, 63B between the respective front and back electrode 16A, 28A of the cell 40A. The external diode 62 may be conveniently mounted on an edge isolation region of the superstrate. The conducting lines 63A, 63B may be implemented by a metal paste dispensed on by screen, nozzle, or ink-jet printing techniques, or metal wires applied by soldering or any known methods.

Alternatively, the external diode 62 can be located in a completely isolated area segregated from any part of the solar cell. Both the front and back electrodes of this external diode 62 should be segregated from main solar cells. To do so, for example, the front electrode can be cut by using laser scribing.

It should also be understood that the bypass diodes are photodiodes, and as such, generate current. But since the area of the bypass diode used in the invention is so small compared to the active solar cells (for example less than 5%, or more particularly about 1%), the diodes won't influence the performance of the active solar cells.

The bypass diodes can also be optionally sheltered from illumination with an additional processing step that produces an opaque layer 64 on the exterior surface 12E of the superstrate 12. An example of an opaque layer 64 is indicated in FIG. 3A by dashed lines. As suggested in the drawing the opaque layer 64 is positioned on the exterior surface 12E to align with footprint of the diode 44A, thereby shadowing the same. A suitable material for the opaque layer is dark paint or a polymer layer with dark pigment.

As noted earlier it lies within the contemplation of the present invention that a diode needs not be separated from each solar cell in the array 40. As shown in FIG. 4B diodes 44A, 44D have been separated from their parent solar cells 40A, 40D. As a result of a positive or inverted paste pattern deployed as shown in FIG. 4A the cells 40B, 40C have been left intact. Each solar cell (as cells 40B, 40C) from which a diode is not separated extends for their full length along the superstrate. However, a diode, such as the diode 44A that is formed by separation from a parent solar cell 40A in accordance with the method of the present invention may be electrically connected in parallel and in opposition to additional cells beyond the next-adjacent (full length) solar cell 40B. For example, as shown in FIG. 4B the diode 44A may be connected in parallel and opposition to a series connection that includes the next adjacent solar cell 40B and one (or more) spaced solar cells (e.g., the cells 40C, 40D or therebeyond).

These electrical connections and corresponding schematic diagram are illustrated in FIGS. 4B and 4C. The physical connection between the anode of the bypass diode 44A and the cathode of the next-adjacent solar cell 40B is effected through contact between the front electrode of the bypass diode 44A and the back electrode 28B of the next-adjacent solar cell 40B. The physical connection between the cathode of the bypass diode 44A and the anode of another solar cell 40D is effected using a separate electrical conductor 48'.

Still further, it should also be appreciated from the foregoing that instead of using an area of a solar cell disposed near an axial end, an area of the solar cell intermediate the ends (e.g., a location near the middle of the solar cell) can also be separated and used to form the bypass diode so long as a suitable modification to the paste pattern is made. It is also within the contemplation of the invention to form several bypass diodes from a single cell. For example, the two end areas of the solar cell may be separated, and make two bypass diodes for a single solar cell.

The array of thin film solar cells and bypass diode(s) formed as described may be finished and formed into a photovoltaic panel by attaching a bus bar with solder and heat sealing with resin and fluoropolymer films, covering with an encapsulant adhesive 67 (such as EVA ethylene vinyl acetate copolymer) and a second exterior support layer 68.

-o-0-o-

In accordance with a second embodiment of the present invention a cell level bypass diode is formed by totally separating (or segregating) a portion of the complete laminated structure from one solar cell and appropriately interconnecting the separated portion to its parent and/or to one or more additional cells. As will be developed, in connection with this embodiment of the invention, the material used to form the front electrode may be either an etchant-resistant material or an etchant-susceptible material. Depending upon the nature of the front electrode material the separation of a bypass diode from a parent cell may be effected using one of two alternative implementation modes. In a first implementation (FIGS. 5A, 6B) a bypass diode is separated from a parent cell using two discrete etching steps which sandwich an intermediate material conversion step. In an alternative implementation (FIG. 7A) the diode is formed using a single etching step.

The first step in practicing either implementation of the second embodiment of the invention involves the disposition of a first etching paste in a first predetermined pattern over the back electrode surface.

The first predetermined etching paste pattern is the same as that described in the first embodiment shown in FIG. 2A. The pattern includes a first stripe 52 of the first etching paste that extends transversely across the first solar cell 40A in a direction substantially perpendicular to the major axis 41A of the first cell. The first stripe 52 of the first etching paste is intersected by a plurality of relatively shorter stripes 54 that are positioned between the major axes of adjacent cells and extend generally parallel to those major axes.

The implementation of the second embodiment used when the front electrode is fabricated from an etchant-resistant material is discussed first. In this case the first etching paste used is the same as that used in the first embodiment, comprising a first acidic etchant and a binder. The first acidic etchant contains only an etchant for the semiconducting material and the back electrode. In general, the chemical composition of the first acidic etchant should be properly formulated to provide effective etch removal of both the back electrode layers and the junction layers lying within the first predetermined etching paste pattern to expose the front electrode. The binder comprises polymeric materials which is similar to those described in the first embodiment.

The first etching paste can be dispensed again using any suitable dispensing techniques such as used for screen, nozzle or ink-jet printing.

The first etching paste pattern may further include first and/or second edge isolation stripe(s) 58, 60 similar to those in the first embodiment.

The first etching paste is allowed to chemically etch the back electrode layer and the underlying junction layer for a first predetermined dwell time depending on the concentration of the etchant and the thickness of the back electrode and the silicon layer. For the thickness of the back electrode and photovoltaic layers as discussed above, a first dwell time on the order of one to two minutes is usually sufficient.

Optionally, in order to reduce the required first dwell time, the first chemical etching paste may be heated to a temperature in the range from about 50° C. to about 200° C., and more particularly to a temperature in the range from about 50° C. to about 100° C. One convenient expedient for raising the temperature of the first chemical etching paste is to raise the temperature of the superstrate using a suitable heating apparatus, such as a hot plate.

At the expiration of the first dwell time the superstrate is sprayed with high pressure water or aqueous alkaline in order to wash off the first etching paste.

It should be noted that a first etching paste that is basic in nature may be used if the back electrode is fabricated from aluminum or from a dual layer material of aluminum and zinc oxide.

Figure 5:
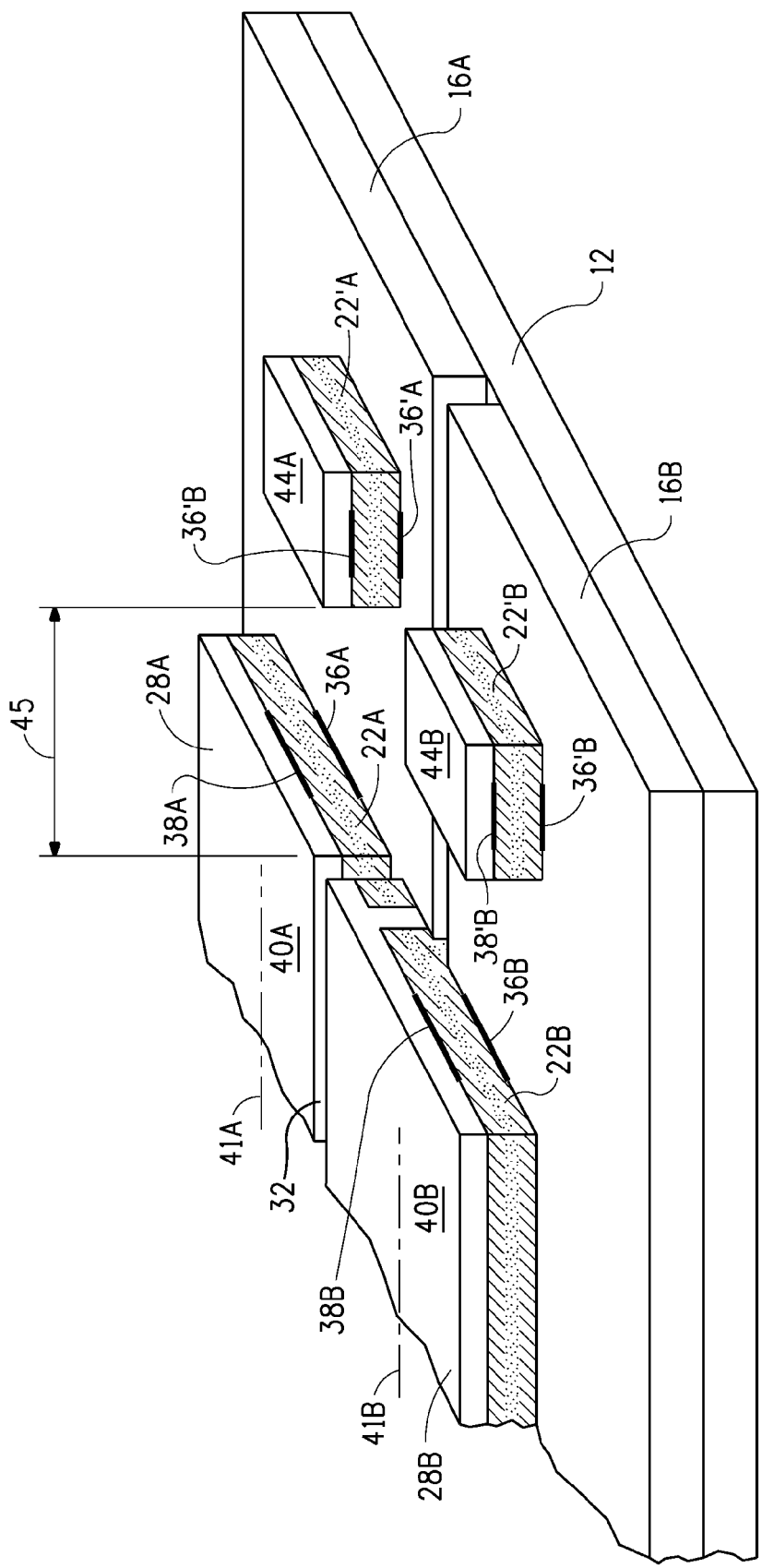
FIG. 5 is a stylized perspective view illustrating the structure of two adjacent cells and adjacent bypass diodes resulting after removal of the first etching paste according to a first implementation of the second embodiment of the present invention.

FIG. 5 shows a stylized perspective view of the array after removal of the first etching paste. The first etching paste is operative to remove from each cell 40A, 40B selected portions of the back electrode 28A, 28B and the photovoltaic junction layer 22A, 22B lying within the first predetermined pattern (FIG. 2A). Because the first etching paste is operative only against the back electrode and the junction layers lying within the first predetermined paste pattern, the front electrode 16A, 16B is exposed but left intact. The scribed break 18 between adjacent front electrode strips 16A, 16B is also exposed.

Since in this discussion it is assumed that the material forming the front electrode is etchant-resistant, an intermediate material conversion step is necessary to render the region of the front electrode on which it is disposed susceptible to an etchant. A suitable conversion material is zinc powder.

Once the conversion material is applied, a second etching material is dispensed in a second predetermined pattern over the now-converted surface zinc oxide surface of the front electrode.

Figure 6A:
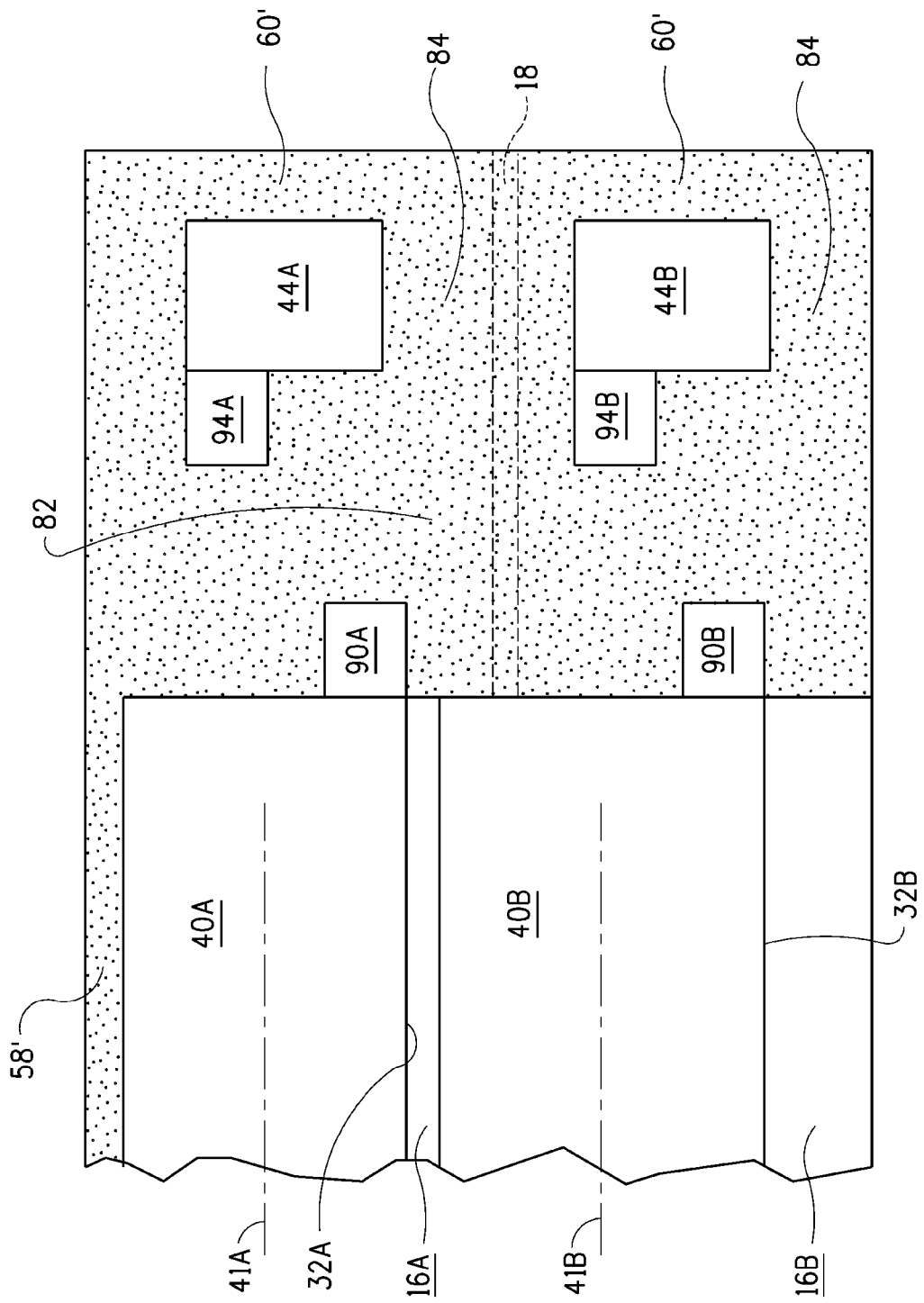
FIG. 6A is a plan view illustrating the array of cells shown in FIG. 5 wherein a second etching paste is disposed in a second predetermined pattern according to the implementation of the second embodiment of the present invention useful when the front electrode is fabricated from an etchant-resistant material.

FIG. 6A shows the second predetermined etching paste pattern as including a first stripe 82 of the second etching paste that extends transversely across the first solar cell 40A in a direction substantially perpendicular to the major axis 41A of the first cell. The first stripe 82 of the second etching paste is intersected by a plurality of a relatively shorter stripes 84 extends generally parallel to the major axes of adjacent cells.

The second predetermined etching paste pattern excludes an area adjacent to the parent solar cell and an area adjacent to the bypass diode that define the outlines conductive tabs 90A, 94A projecting from the front electrode of the parent solar cell 40A and the bypass diode 44A. These tabs 90A, 94A are electrically connected to semiconducting material of the first type in the solar cell 40A and to the semiconducting material of the first type in the bypass diode 44A. The tabs provide a convenient structure whereby a bypass diode can be interconnected to one (or more) of the cells in the array. As shown, similar tabs are provided for the other cells and the bypass diodes separated therefrom.

The second etching paste pattern may further include first and/or second edge isolation stripe(s) 58', 60' if they are included in the first etching paste pattern.

A suitable second etching paste comprises a second acidic etchant and a binder. The second acidic etchant contains only an etchant for the front electrode. An example of the second acidic etchant for zinc oxide is hydrochloric acid. The second etching paste is dispensed over a portion of the exposed front electrode in the second predetermined pattern using any suitable dispensing techniques such as those described in the application of the first etching paste. The binder in the second etching paste is the same as that in the first etching paste.

The second etching paste is allowed to chemically etch the front electrode layer for a second predetermined dwell time on the order of one to two minutes depending on the concentration of the etchant and the thickness of the front electrode. Optionally, in order to reduce the required second dwell time, the second chemical etching paste may be heated to a temperature in the range from about 50° C. to about 200° C., and more particularly to a temperature in the range from about 50° C. to about 100° C. Again one convenient expedient for raising the temperature of the second etching paste is to raise the temperature of the superstrate using a suitable heating apparatus, such as a hot plate.

At the expiration of the second dwell time the superstrate is sprayed with high pressure water or aqueous alkaline in order to wash off the second etching paste.

The second etching paste may alternatively be basic in nature.

Figures 6B, 6C:
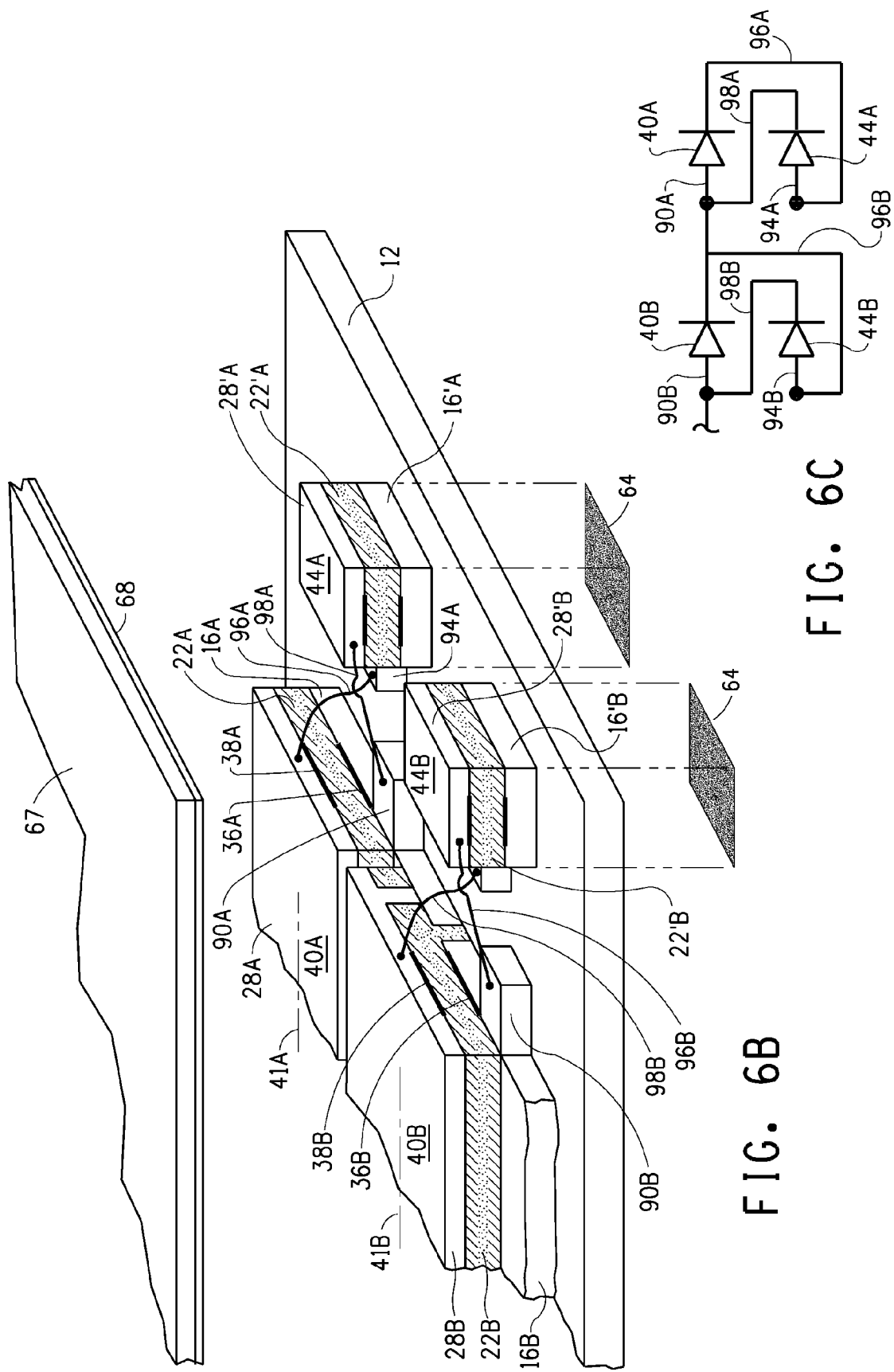
FIG. 6B a stylized perspective view illustrating the structure of two adjacent cells and two totally separated adjacent bypass diodes resulting after removal of the second etching paste, with the bypass diode being connected to the corresponding cell according to the second embodiment of the present invention.
FIG. 6C is an equivalent circuit diagram of the cell with the bypass diode being connected to the corresponding cell shown in FIG. 6B according to the second embodiment of the present invention.

Thus, as shown in FIG. 6B, as a result of the etching action each silicon solar cell stripe is separated into two parts: viz., a major active cell (e.g., parent solar cells 40A, 40B) with the conductive tab (e.g. 90A, 90B) and respective totally separated bypass diodes (e.g., diodes 44A, 44B). Each totally separated bypass diode has a respective conductive tab (e.g. 94A, 94B), (FIG. 6B).

Specifically, the bypass diode 44A includes a portion 16'A of a front electrode layer (segregated from the front electrode layer 16A of the parent cell 40A), a portion 22'A of a photovoltaic junction layer (segregated from the photovoltaic junction layer 22A of the parent cell 40A), and a portion 28'A of the back electrode (segregated from the back electrode 28A of the parent cell 40A). It is stated for clarity that the primed reference characters indicate that the primed elements of the bypass diode were previously integral with the corresponding elements of the solar cell but are now totally separated therefrom. The segregated portion of the junction layer 22'A is supported by the front electrode 16'A.

The interface 36'A defined within the diode 44A between the front electrode 16'A and the one of the semiconducting strata of the segregated junction layer 22'A is substantially coplanar with the corresponding interface 36A defined in the parent cell 40A. Similarly, the interface 38'A defined within the diode 44A between the back electrode 28'A and the other semiconducting strata of the segregated junction layer 22'A is substantially coplanar with the corresponding interface 38A in the parent cell 40A.

Structurally, the junction layer 22'A of the bypass diode 44A is spaced a predetermined distance 45 in the direction of the major axis 41A from the junction layer 22A of the first cell 40A. This predetermined distance 45 is governed by the dimension of the stripe 52 of the first etching paste. Similarly, the lateral spacing between the adjacent bypass diodes 44A, 44B is governed by the dimension of the etching paste stripe 54. The dimensions of the stripes 52, and 54 are selected such that the surface area of the bypass diode 44A is within the range from about 1% to about 5% of the surface area of the first solar cell 40A.

It is noted that if edge isolation etching paste stripe(s) 58 and/or 60 are deployed the action of the first and the second etching paste would remove the back electrode, the junction layers, and the front electrode in those regions, thus obviating the need for the removal of material in the region 16R as discussed in connection with the first embodiment.

The semiconducting material of the first type of the separated portion of the junction layer 22'A of the diode 44A is connected with the semiconducting material of the second type of the parent solar cell 40A through the tab 94A of the front electrode of bypass diode 44A and the back electrode of the parent cell 40A by a conductor 96A. The semiconducting material of a first type of the solar cell 40A is connected with the semiconducting material of the second type of the bypass diode (44A) through the tab 90A of front electrode of parent cell 40A and the back electrode of bypass diode 44A by a conductor 98A. In FIG. 6B the conductors 96A, 98A (and 96B, 98B) are implemented using metal wire. The equivalent electrical schematic of the interconnection of the diode 44A with the first solar cell 40A is shown in FIG. 6C.

Each of the other bypass diodes segregated from a cell in the array may be interconnected with the corresponding parent cell in a manner analogous to that described hereinabove.

Since the bypass diode is completely separated from its parent cell it is not necessary that the diode so formed be connected electrically across its parent. That is to say, a diode produced from any selected parent cell may be connected in parallel with and in opposition to any cell (or cells) in the array.

For example, as shown in FIGS. 6D, 6E the diode 44A, totally separated from its parent cell 40A, may be connected to the chosen cell 40B. To effect this connection the tab 94A projecting from the front electrode 16'A of the diode 44A may be connected via the conductor 96A to the back electrode 28B of the chosen cell 40B. The tab 90B projecting from the front electrode 16B of the cell 40B is connected via the conductor 98A to the back electrode 28'A of the diode 44A. FIG. 6E is the schematic diagram of this connection.

The conducting lines 96A, 98A (96B, 98B, etc.) may be alternatively implemented by a metallization dispensed on by screen, nozzle, or ink-jet printing techniques, or by a flexible circuit.

It should also be understood that the bypass diodes are photodiodes, and as such, generate current. But since the area of the bypass diode used in the invention is so small compared to the active solar cells (<5%; for example, about 1%), the diodes won't influence the performance of the active solar cells.

The bypass diodes can also be optionally sheltered from illumination with an additional processing step that produces the opaque layer 64 on the exterior surface 12E of the superstrate 12 (FIG. 6B).

The array of thin film solar cells and bypass diode(s) formed as described may be finished into a photovoltaic panel by attaching a bus bar with solder and heat sealing with resin and fluoropolymer films, covering with an encapsulant adhesive 67 (such as EVA ethylene vinyl acetate copolymer) and a second exterior support layer 68 (broken away for clarity of illustration in FIG. 6B).

Figure 6F:
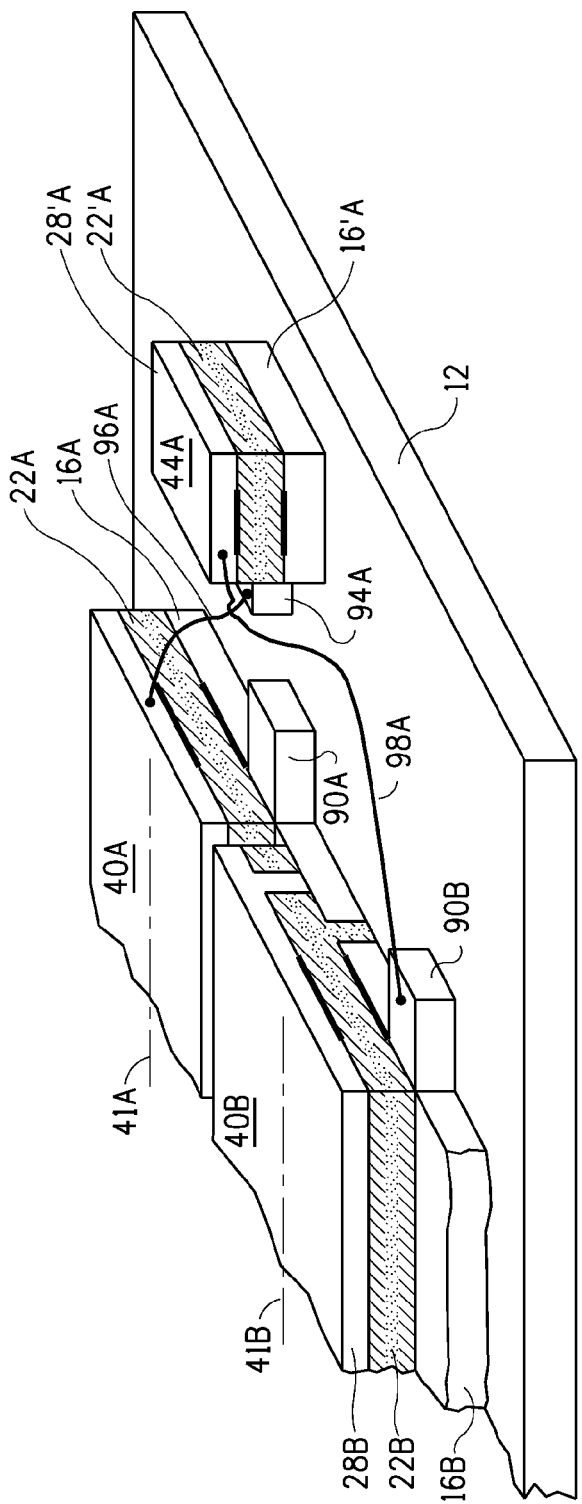
FIG. 6F is a stylized perspective view, similar to FIG. 6B, illustrating the structure of two adjacent cells and a single bypass diode, with the bypass diode being connected to the corresponding parent cell and at least one additional cell according to the first implementation of the second embodiment of the present invention.
Figure 6G:
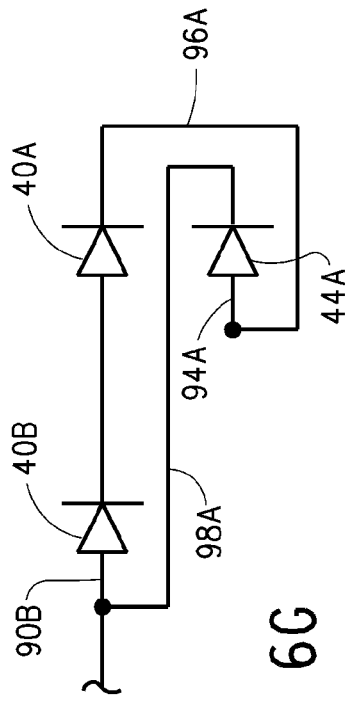
FIG. 6G is an equivalent circuit diagram of the cell with the bypass diode being connected as shown in FIG. 6F.

As alluded to earlier, a bypass diode 44A may be connected in parallel with an opposition more than one cell in the array. FIGS. 6F and 6G illustrate a situation in which a diode 44A is connected to provide a bypass function for one chosen cell, e.g., the parent cell 40A, and any other chosen cell, e.g., the cell 40B. In FIG. 6F the one chosen cell 40A and the other chosen cell 40B are adjacent. (It is again noted that the parent cell of the diode 44A needs not be selected as the one chosen cell.) The connection is effected through a conductor 96A extending between the tab 94A and the back electrode 28A of the one chosen cell and the conductor 98A between the back electrode 28'A of the diode 44A and the tab 40B of the other chosen cell 40B.

Figure 6H:
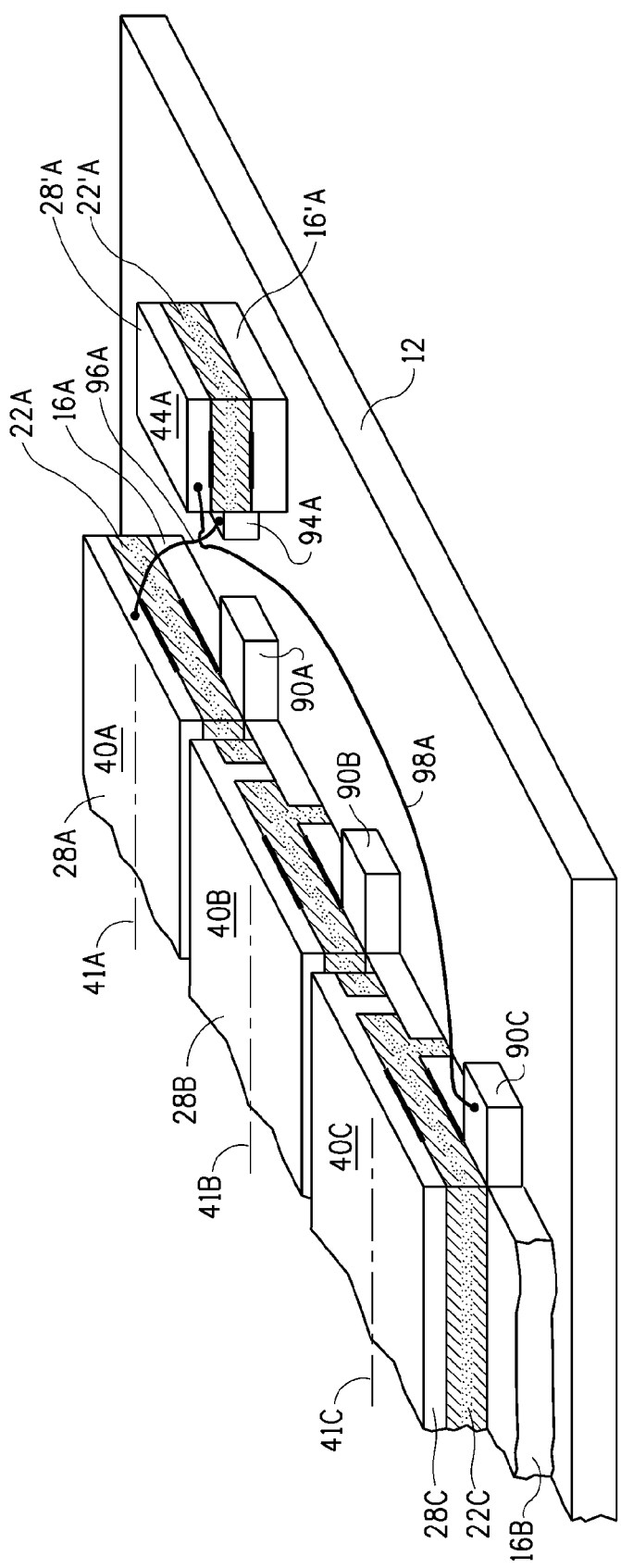
FIG. 6H is a stylized perspective view, similar to FIG. 6F, illustrating the structure of three adjacent cells and a single bypass diode, with the bypass diode being connected to the its parent cell and at least one additional cell, with at least one intermediate cell being disposed therebetween.
Figure 6I:
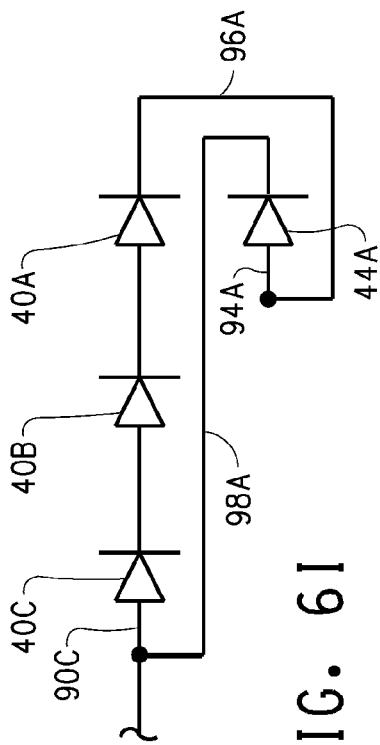
FIG. 6I is an equivalent circuit diagram of the cell with the bypass diode being connected as shown in FIG. 6H.

FIGS. 6H and 6I illustrate an arrangement in which a single diode 44A is connected across cells 40A, 40B, 40C. In this situation the one chosen cell (the cell 40A) and the other chosen cell (in this case, the cell 40C) are not adjacent.

Instead of using a second etching paste, it should be appreciated that once the front electrode has been exposed by the action of the first (acidic or basic) etching paste, the front electrode may be removed using a laser.

-o-0-o-

The implementation of the second embodiment utilized when the front electrode is fabricated from an etchant-susceptible material is next discussed in connection with FIGS. 7A and 7B. A suitable etchant-susceptible material useful for the front electrode is selected from the group consisting of: indium-tin oxide (ITO), zinc oxide (ZnO), gallium oxide (GaO) and tin oxide.

Figure 7A:
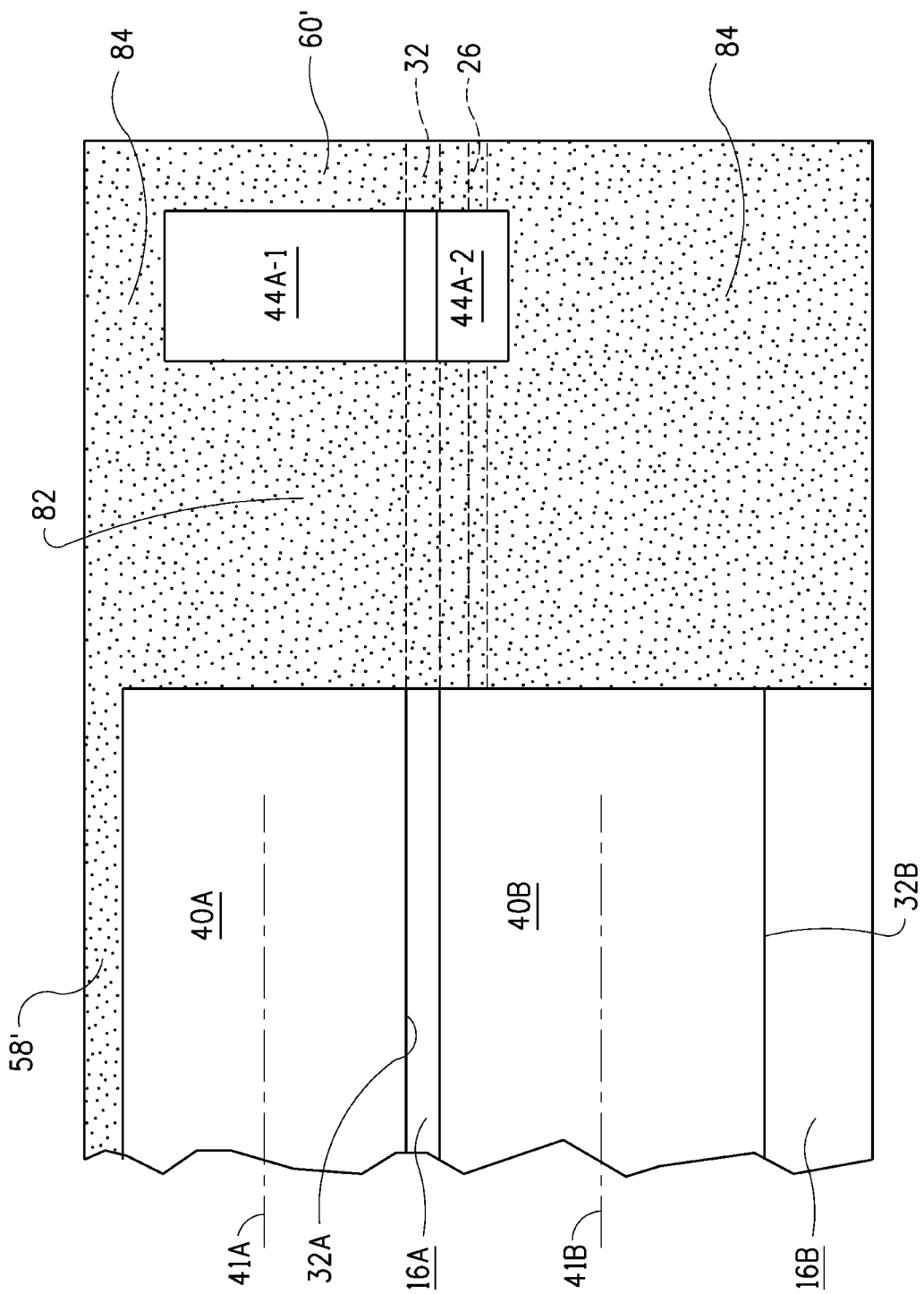
FIG. 7A is a plan view, similar to FIG. 6A, showing the disposition of an etching paste according to an alternate implementation of the second embodiment of the present invention useful when the front electrode is fabricated from an etchant-susceptible material.

In this instance an etching paste operative against all of the layers of the laminate is dispensed in the desired pattern (e.g, the pattern as shown in FIG. 7A in which the diode to be formed overlies the second scribe 26 and the third scribe 32). A suitable etching material for this purpose may be either acidic or basic in nature (if the front electrode is zinc oxide and the back electrode is either aluminum or a dual layer aluminum-zinc oxide).

Figure 7B:
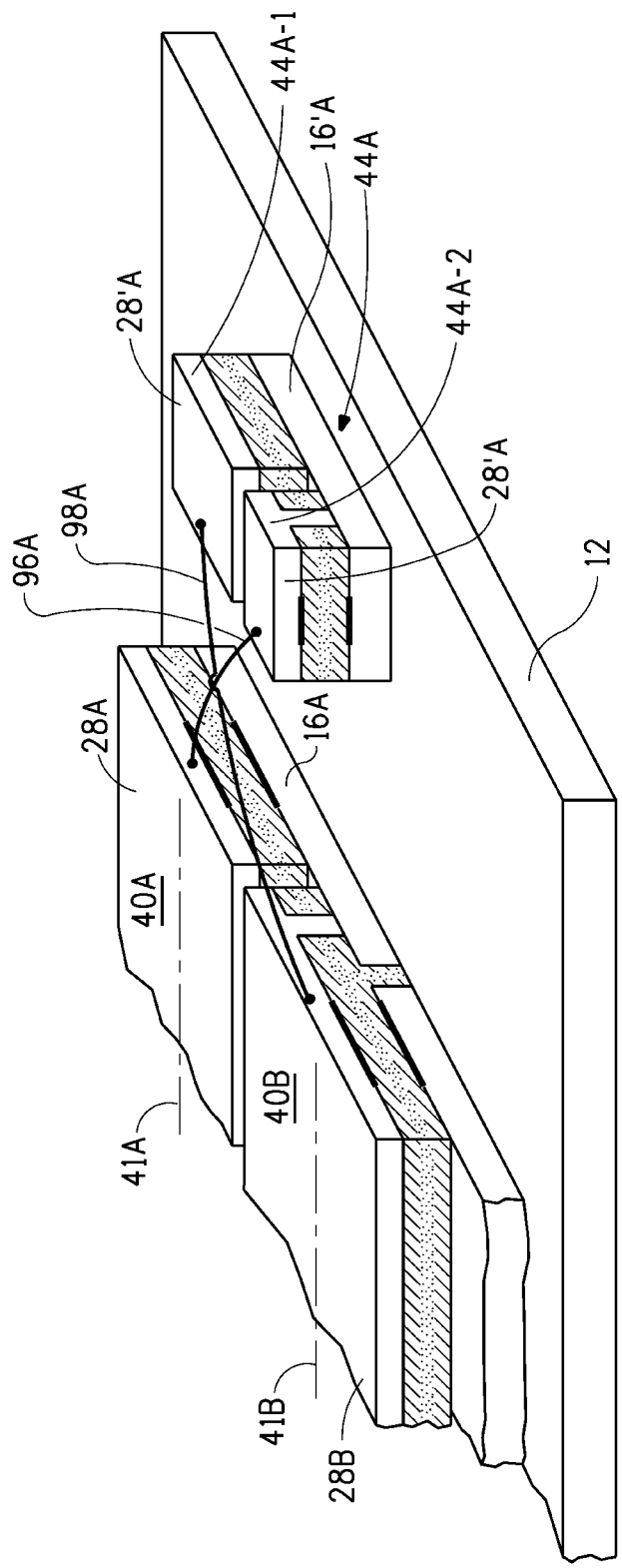
FIG. 7B is a stylized perspective view illustrating a totally separated, dual-lobed bypass diode produced as a result of the etching paste disposed as in FIG. 7A.

As illustrated in FIG. 7B the etching material removes all the material from the laminate and forms a bypass diode having two lobes 44A-1, 44A-2. The lobes 44A-1, 44A-2 share the same front electrode.

The front electrode 16'A of the bypass diode is connected from the lobe 44A-2 via the conductor 96A to the back electrode 28A of the solar cell 40A. The back electrode 28'A of the lobe 44A-1 of the bypass diode is connected via the conductor 98A to the front electrode 16A of the cell 40A (through the back electrode 28B of the cell 40B. As in the case of other connections, metal wires, flexible circuits or a metallization may be used to implement the conductors 96A, 98A.

It should be appreciated that any of the etching steps outlined above in connection with second embodiment may be alternatively implemented using the "inverse" techniques discussed earlier in connection with the first embodiment. In these cases a masking paste may be applied in an inverse pattern which leaves the unmasked areas uncovered. After the masking paste is dried, the unmasked areas are exposed to a wet etchant. The unmasked areas may be exposed by applying the wet etchant directly thereto or by immersing the entire cell array into the wet etchant. The masking paste is then stripped away. In this alternative method the pattern of the mask is the invert of the "positive" pattern created when using etchant paste. The masking paste mentioned earlier may be used.

-o-0-o-

It should be apparent from the foregoing that in accordance with either embodiment of the present invention it is possible to utilize a small amount of silicon thin-film solar cells (preferably along the end area), all solar cells in the panel are protected by the bypass diodes.

Those skilled in the art, having the benefit of the teachings of the present invention may impart modifications thereto. Such modifications are to be construed as lying within the contemplation of the present invention, as defined by the appended claims.

What is claimed is:

1. A method for producing a thin-film solar cell with a cell level integrated bypass diode, the method comprising the steps of:
   a) forming an array of solar cells on a support layer, the solar cells being connected in electrical series, the array including at least a first, a second, and a third solar cell, the first and the second solar cells being adjacent to each other, and
   each solar cell of the array being a laminated structure comprising:
      a photovoltaic junction layer including a semiconducting material of a first type and a semiconducting material of a second type,
      a front electrode disposed in electrical contact with the semiconducting material of the first type, and
      a back electrode disposed in electrical contact with the semiconducting material of the second type;
   b) separating from the first solar cell at least a portion of both the back electrode and the photovoltaic junction layer, leaving intact the front electrode of the first solar cell,
   such that the semiconducting material of the first type of the separated portion of the photovoltaic junction layer of the first solar cell is electrically connected with the semiconducting material of the second type of the second solar cell through physical contact between the front electrode of the first solar cell and the back electrode of the second solar cell; and,
   c) using the separated portion of the back electrode of the first solar cell, connecting the semiconducting material of the second type of the separated portion of the photovoltaic junction layer of the first solar cell to the semiconducting material of the first type of the second solar cell,
   such that the bypass diode is thereby defined on the support layer, the bypass diode being connected in parallel with and in opposition to the second solar cell.

2. A method for producing a thin-film solar cell with a cell level integrated bypass diode, the method comprising the steps of:
   a) forming an array of solar cells on a support layer, the solar cells being connected in electrical series, the array including at least a first, a second, and a third solar cell, each of the first, second, and third solar cells being adjacent to at least one other cell, and
   each solar cell of the array being a laminated structure comprising:
      a photovoltaic junction layer including a semiconducting material of a first type and a semiconducting material of a second type,
      a front electrode disposed in electrical contact with the semiconducting material of the first type, and
      a back electrode disposed in electrical contact with the semiconducting material of the second type;
   b) separating from the first solar cell at least a portion of both the back electrode and the photovoltaic junction layer, leaving intact the front electrode of the first solar cell,
   such that the semiconducting material of the first type of the separated portion of the photovoltaic junction layer of the first solar cell is electrically connected with the semiconducting material of the second type of the second solar cell through physical contact between the front electrode of the first solar cell and the back electrode of the second solar cell; and
   c) using the separated portion of the back electrode of the first solar cell, connecting the semiconducting material of the second type of the separated portion of the photovoltaic junction layer of the first solar cell to the semiconducting material of the first type of the third solar cell,
   such that the bypass diode is defined on the support layer, the bypass diode being connected in parallel and in opposition to both the second and third solar cells.

3. A method
for producing a thin-film solar cell with a cell level integrated bypass diode, the method comprising the steps of:
   a) forming an array of solar cells on a support layer, the solar cells being connected in electrical series, the array including at least a first, a second, and a third solar cell, wherein the first and the second solar cells are adjacent to each other and the third solar cell is spaced a predetermined number of solar cells away from the second solar cell, and
 each solar cell of the array being a laminated structure comprising:
  a photovoltaic junction layer including a semiconducting material of a first type and a semiconducting material of a second type,
  a front electrode disposed in electrical contact with the semiconducting material of the first type, and
  a back electrode disposed in electrical contact with the semiconducting material of the second type;
b) separating from the first solar cell at least a portion of both the back electrode and the photovoltaic junction layer, leaving intact the front electrode of the first solar cell,
 such that the semiconducting material of the first type of the separated portion of the photovoltaic junction layer of the first solar cell is electrically connected with the semiconducting material of the second type of the second solar cell through physical contact between the front electrode of the first solar cell and the back electrode of the second solar cell; and
c) using the separated portion of the back electrode of the first solar cell, connecting the semiconducting material of the second type of the separated portion of the photovoltaic junction layer of the first solar cell to the semiconducting material of the first type of the third solar cell,
 such that the bypass diode is thereby defined on the support layer, the bypass diode being connected in parallel and in opposition to the second and third solar cells and to all solar cells therebetween.

4. A method for producing a thin-film solar cell with a cell level integrated bypass diode, the method comprising the steps of:
a) forming an array of solar cells on a support layer, the solar cells being connected in electrical series, the array including at least a first, a second and a third solar cell, each solar cell of the array being a laminated structure comprising:
  a photovoltaic junction layer including a semiconducting material of a first type and a semiconducting material of a second type,
  a front electrode disposed in electrical contact with the semiconducting material of the first type, and
  a back electrode disposed in electrical contact with the semiconducting material of the second type;
b) separating from a selected parent solar cell of the solar cell array at least a portion of each of the front electrode, the back electrode, and the photovoltaic junction layer, thereby totally segregating the separated portions of the front electrode, back electrode and photovoltaic junction layer from the selected parent solar cell;
c) using the separated portion of the back electrode, connecting the semiconducting material of the second type of the separated portion of the photovoltaic junction layer to the semiconducting material of the first type of any one chosen solar cell in the array; and
d) connecting the semiconducting material of the first type of the separated portion of the photovoltaic junction layer to the semiconducting material of the second type of a different chosen solar cell in the array,
such that, after step d), the bypass diode is defined on the support layer, the bypass diode being connected in parallel with and in opposition to at least the one chosen solar cell and the different chosen solar cell.

5. The method of claim 4 wherein,
the first and the second solar cells are adjacent to each other, and wherein,
during the step c) the one chosen solar cell is the first solar cell, and wherein,
during the step d) the different chosen solar cell is the second solar cell,
whereby the bypass diode is connected in parallel with and in opposition to at least the first solar cell and the second solar cell.

6. The method of claim 4 wherein,
the first and third solar cells are spaced with at least the second cell therebetween, and wherein,
during the step c) the one chosen solar cell is the first solar cell, and wherein,
during the step d) the different chosen solar cell is the third solar cell,
whereby a bypass diode is defined on the support layer, the bypass diode being connected in parallel with and in opposition to the first solar cell and the third solar cells as well as the second solar cell therebetween.

7. A method for producing a thin-film solar cell with a cell level integrated bypass diode, the method comprising the steps of:
a) forming at least two solar cells on a support layer, each solar cell being a laminated structure comprising:
  a photovoltaic junction layer having a semiconducting material of a first type and a semiconducting material of a second type,
  a front electrode disposed in electrical contact with one of the semiconducting materials, and
  a back electrode disposed in electrical contact with the other one of the semiconducting materials,
b) separating from a first one of the solar cells a portion of the photovoltaic junction layer,
 the semiconducting material of the first type of the separated portion of the photovoltaic junction layer being electrically connected with the semiconducting material of the second type of the second solar cell through physical contact between the front electrode of the first solar cell and the back electrode of the second solar cell; and
c) connecting the semiconducting material of the second type of the separated portion of the photovoltaic junction layer with the semiconducting material of the first type of the second solar cell,
whereby a bypass diode is defined on the support layer, the bypass diode being connected in parallel and in opposition to the second solar cell.

8. The method of claim 7 wherein the separating step b) itself comprises the steps of:
b1) dispensing an etchant material in a predetermined pattern over the first solar cell, the etchant material being able to etch through both the back electrode and the photovoltaic junction layer of the portion of the first solar cell covered by the etchant; and
b2) removing the etchant material from the first solar cell.

9. The method of claim 8 wherein the first solar cell has a major axis therethrough,
wherein the etchant material is an etchant paste, and
wherein the predetermined pattern includes
 a first stripe extending over the back electrode of the first cell in a direction substantially perpendicular to the major axis of the first cell, and
 a second stripe intersecting the first stripe and extending over the back electrode of the first cell in a direction substantially parallel to the major axis of the first cell.

10. The method of claim 9 wherein the etchant paste includes an acid selected from the group consisting of nitric acid, hydrochloric acid, hydrofluoric acid, and mixtures thereof.

11. The method of claim 9 wherein the etchant paste includes a base selected from the group consisting of alkali hydroxide, ammonium hydroxide and tetramethylammonium hydroxide and mixtures thereof.

12. The method of claim 8 further comprising the step of:
after step b1), heating the etchant material to a temperature in the range from about 50° C. to about 200° C.

13. The method of claim 12 wherein the etchant material is heated to a temperature in the range from about 50° C. to about 100° C.

14. The method of claim 7 further comprising the step of:
d) covering the bypass diode with a protective layer able to shelter the bypass diode from illumination.

15. The method of claim 7 wherein the first solar cell has a major axis therethrough, and wherein the separating step b) itself comprises the steps of:
b1) dispensing a masking paste over a portion of the array thereby to define a predetermined unmasked pattern, wherein the predetermined unmasked pattern includes:
a first stripe extending over the back electrode of the first cell in a direction substantially perpendicular to the major axis of the first cell, and
a second stripe intersecting the first stripe and extending over the back electrode of the first cell in a direction substantially parallel to the major axis of the first cell;
b2) drying masking paste;
b3) exposing the predetermined unmasked pattern to a wet etchant, the wet etchant being able to etch through both the back electrode and the photovoltaic junction layer of the portion of the first solar cell within the unmasked pattern; and
b4) removing the masking paste.

16. The method of claim 15 wherein the wet etchant includes an acid selected from the group consisting of nitric acid, hydrochloric acid, hydrofluoric acid, and mixtures thereof.

17. The method of claim 15 wherein the wet etchant includes a base selected from the group consisting of alkali hydroxide, ammonium hydroxide and tetramethylammonium hydroxide and mixtures thereof.

18. The method of claim 7 further comprising the step of:
e) connecting a second bypass diode in parallel and in opposition to the first solar cell.

19. A method for producing a thin-film solar cell with a cell level integrated bypass diode, the method comprising the steps of:
a) forming at least two solar cells on a support layer, each solar cell being a laminated structure comprising:
a photovoltaic junction layer including a semiconducting material of a first type and a semiconducting material of a second type,
a front electrode formed of a transparent conductive oxide resistant to an etchant disposed in electrical contact with the semiconducting material of the first type, and
a back electrode disposed in electrical contact with the semiconducting material of the second type,
the front electrode of one of the solar cells being in electrical contact with the back electrode of the other solar cell,
b) disposing an etchant material in a predetermined pattern over the back electrode of the first solar cell,
the etchant material being operative to remove the back electrode and the semiconducting materials lying within the predetermined pattern while leaving the etchant-resistant front electrode, thereby to separate from the first solar cell a portion of the photovoltaic junction layer and a portion of the back electrode overlaying the same,
the separated portion of the junction layer being supported on the front electrode of the first solar cell such that the semiconducting material of the first type of the separated portion of the junction layer is electrically connected with the semiconducting material of the second type of the second solar cell through physical contact between the front electrode of the first solar cell and the back electrode of the second solar cell;
c) using the portion of the back electrode overlaying the separated portion of the junction layer, connecting the semiconducting material of the second type of the separated portion of the junction layer with the semiconducting material of the first type of the second solar cell; and
whereby, a bypass diode is defined on the support layer, the bypass diode being electrically connected in parallel and in opposition to the second solar cell.

20. The method of claim 19 wherein the first solar cell has a major axis therethrough,
wherein the etchant material is an etchant paste, and
wherein the predetermined pattern includes
a first stripe extending over the back electrode of the first cell in a direction substantially perpendicular to the major axis of the first cell, and
a second stripe intersecting the first stripe and extending over the back electrode of the first cell in a direction substantially parallel to the major axis of the first cell.

21. The method of claim 20 wherein the etchant paste includes an acid selected from the group consisting of nitric acid, hydrochloric acid, hydrofluoric acid, and mixtures thereof.

22. The method of claim 20 wherein the etchant paste includes a base selected from the group consisting of alkali hydroxide, ammonium hydroxide and tetramethylammonium hydroxide and mixtures thereof.

23. The method of claim 19 further comprising the step of:
during step b), heating the etchant material to a temperature in the range from about 50° C. to about 20020 C.

24. The method of claim 23 wherein the etchant material is heated to a temperature in the range from about 50° C. to about 100° C.

25. The method of claim 19 further comprising the step of:
d) covering the bypass diode with a protective layer able to shelter the bypass diode from illumination.

26. The method of claim 19 wherein the first solar cell has a major axis therethrough, and wherein the separating step b) itself comprises the steps of:
b1) dispensing a masking paste over a portion of the array thereby to define a predetermined unmasked pattern, wherein the predetermined unmasked pattern includes:
a first stripe extending over the back electrode of the first cell in a direction substantially perpendicular to the major axis of the first cell, and
a second stripe intersecting the first stripe and extending over the back electrode of the first cell in a direction substantially parallel to the major axis of the first cell,
b2) drying masking paste;
b3) exposing the predetermined unmasked pattern to a wet etchant, the wet etchant being able to etch through both the back electrode and the photovoltaic junction layer of the portion of the first solar cell within the unmasked pattern; and b4) removing the masking paste.

27. The method of claim 26 wherein the wet etchant includes an acid etchant selected from the group consisting of nitric acid, hydrochloric acid, hydrofluoric acid, and mixtures thereof.

28. The method of claim 26 wherein the wet etchant includes a base selected from the group consisting of alkali hydroxide, ammonium hydroxide and tetramethylammonium hydroxide and mixtures thereof.

29. The method of claim 19 further comprising the step of:

e) connecting a second bypass diode in parallel and in opposition to the first solar cell.

30. Method of making a solar panel comprising the steps of:

a) providing a first and a second support layer;

b) forming at least two solar cells on the first support layer, each solar cell being a laminated structure comprising:
a photovoltaic junction layer having a semiconducting material of a first type and a semiconducting material of a second type,
a front electrode disposed in electrical contact with one of the semiconducting materials, and
a back electrode disposed in electrical contact with the other one of the semiconducting materials, c) forming a bypass diode on the first support layer by the steps of:
i) separating from a first one of the solar cells a portion of the photovoltaic junction layer,
the semiconducting material of the first type of the separated portion of the photovoltaic junction layer being electrically connected with the semiconducting material of the second type of the second solar cell through physical contact between the front electrode of the first solar cell and the back electrode of the second solar cell; and
ii) connecting the semiconducting material of the second type of the separated portion of the photovoltaic junction layer with the semiconducting material of the first type of the second solar cell,
whereby a bypass diode is defined on the first support layer, the bypass diode being connected in parallel and in opposition to the second solar cell; and d) covering the solar cells and the bypass diode on the first support layer with the second support layer.

31. The method of claim 30 wherein the first support layer comprises a transparent superstrate.

32. The method of claim 30 wherein the first support layer comprises a non-transparent substrate.

33. The method of claim 30 wherein the separating step c1) itself comprises the step of:

dispensing an etchant material in a predetermined pattern over the first solar cell, the etchant material being able to etch through both the back electrode and the photovoltaic junction layer of the portion of the first solar cell covered by the etchant; and the method further comprising the step of:

e) before step d), removing the etchant material from the first solar cell.

34. The method of claim 33 wherein the first solar cell has a major axis therethrough,
wherein the etchant material is an etchant paste, and
wherein the predetermined pattern includes
a first stripe extending over the back electrode of the first cell in a direction substantially perpendicular to the major axis of the first cell, and
a second stripe intersecting the first stripe and extending over the back electrode of the first cell in a direction substantially parallel to the major axis of the first cell.

35. The method of claim 34 wherein the etchant paste includes an acid selected from the group consisting of nitric acid, hydrochloric acid, hydrofluoric acid, and mixtures thereof.

36. The method of claim 34 wherein the etchant paste includes a base selected from the group consisting of alkali hydroxide, ammonium hydroxide and tetramethylammonium hydroxide and mixtures thereof.

37. The method of claim 33 further comprising the step of:
during step c), heating the etchant material to a temperature in the range from about 50° C. to about 200° C.

38. The method of claim 37 wherein the etchant material is heated to a temperature in the range from about 50° C. to about 100° C.

39. The method of claim 30 further comprising the step of:
e) covering the bypass diode with a protective layer able to shelter the bypass diode from illumination.

40. The method of claim 30 wherein the first solar cell has a major axis therethrough, and wherein the separating step c1) itself comprises the steps of:
i) dispensing a masking paste over a portion of the array thereby to define a predetermined unmasked pattern, wherein the predetermined unmasked pattern includes:
a first stripe extending over the back electrode of the first cell in a direction substantially perpendicular to the major axis of the first cell, and
a second stripe intersecting the first stripe and extending over the back electrode of the first cell in a direction substantially parallel to the major axis of the first cell,
ii) drying masking paste;
iii) exposing the predetermined unmasked pattern to a wet etchant, the wet etchant being able to etch through both the back electrode and the photovoltaic junction layer of the portion of the first solar cell within the unmasked pattern; and
iv) removing the masking paste.

41. The method of claim 40 wherein the wet etchant includes an acid selected from the group consisting of nitric acid, hydrochloric acid, hydrofluoric acid, and mixtures thereof.

42. The method of claim 30 wherein the wet etchant includes a base selected from the group consisting of alkali hydroxide, ammonium hydroxide and tetramethylammonium hydroxide and mixtures thereof.

43. The method of claim 30 further comprising the step of:
e) connecting a second bypass diode in parallel and in opposition to the first solar cell.

* * * * *